(12) United States Patent
Kang

(10) Patent No.: US 6,900,872 B2
(45) Date of Patent: May 31, 2005

(54) ARRAY SUBSTRATE FOR IPS MODE LIQUID CRYSTAL DISPLAY DEVICE

(75) Inventor: Jin-Gyu Kang, Incheon (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/387,450

(22) Filed: Mar. 14, 2003

(65) Prior Publication Data

US 2004/0080700 A1 Apr. 29, 2004

(30) Foreign Application Priority Data

Oct. 28, 2002 (KR) .................................. 10-2002-65803

(51) Int. Cl.⁷ ........................ G02F 1/1343; G02F 1/136
(52) U.S. Cl. .......................... 349/141; 349/38; 349/43
(58) Field of Search ............................ 349/38, 39, 42, 349/43, 141

(56) References Cited

U.S. PATENT DOCUMENTS

| | | | |
|---|---|---|---|
| 5,598,285 A | 1/1997 | Kondo et al. | 349/39 |
| 5,745,207 A | 4/1998 | Asada et al. | 349/141 |
| 5,838,037 A | 11/1998 | Masutani et al. | 257/296 |
| 5,852,485 A * | 12/1998 | Shimada et al. | 349/141 |
| 5,946,060 A | 8/1999 | Nishiki et al. | 349/141 |
| 5,990,987 A | 11/1999 | Tanaka | 349/43 |
| 6,028,653 A | 2/2000 | Nishida | 349/141 |
| 6,097,454 A | 8/2000 | Zhang et al. | 349/43 |
| 6,207,480 B1 | 3/2001 | Cha et al. | 438/149 |
| 6,448,116 B1 | 9/2002 | Wong | 438/155 |
| 6,611,310 B2 * | 8/2003 | Kurahashi et al. | 349/141 |
| 6,661,492 B2 * | 12/2003 | Kim | 349/141 |
| 2001/0002146 A1 * | 5/2001 | Komatsu | 349/141 |
| 2003/0117560 A1 * | 6/2003 | Yang et al. | 349/141 |

FOREIGN PATENT DOCUMENTS

| | | |
|---|---|---|
| JP | 9-5764 | 1/1997 |
| JP | 9-73101 | 3/1997 |
| JP | 9-101538 | 4/1997 |
| JP | 9-105908 | 4/1997 |

OTHER PUBLICATIONS

R. Kiefer et al., "In–Plane Switching of Nematic Liquid Crystals", Japan Display 1992, pp. 547–550.

M. Ohta et al., "Development of Super–TFT–LCDs with In–Plane Switching Mode," Proceedings of the Fifteenth International Display Research Conference, Asia Display '95, Oct. 16–18, 1995, pp. 707–710.

M. Oh–e et al., "Principles and Characteristics of Electro–Optical Behaviour with In–Plane Switching Mode," Proceedings of the Fifteenth International Display Research Conference, Asia Display '95, Oct. 16–18, 1995, pp. 577–580.

* cited by examiner

Primary Examiner—Tarifur R. Chowdhury
(74) Attorney, Agent, or Firm—Morgan Lewis & Bockius LLP

(57) ABSTRACT

An array substrate for an in-plane switching (IPS) mode liquid crystal display (LCD) device includes a gate line formed along a first direction on a substrate, a storage line formed along the first direction on the substrate and spaced apart from the gate line, a data line formed along a second direction on the substrate, the data line defining a pixel region by crossing the gate line, a thin film transistor at a crossing of the gate line and the data line, the thin film transistor having a gate electrode, a semiconductor layer, a source electrode, and a drain electrode, a pixel electrode connected to the drain electrode, a common electrode having a plurality of vertical portions connected to the storage line, the common electrode having outermost vertical portions adjacent and parallel to the data line and spaced apart from the pixel electrode, and a semiconductor line beneath the data line and extending from the semiconductor layer to both sides of the data line to cover portions of the common electrodes adjacent to the data line.

14 Claims, 26 Drawing Sheets

ARRAY SUBSTRATE FOR IPS MODE LIQUID CRYSTAL DISPLAY DEVICE

The present invention claims the benefit of Korean Patent Application No. 2002-65803, filed in Korea on Oct. 28, 2002, which is hereby incorporated by reference.

BACKGROUND OF THE INVENTION

1. Field of the Invention

The present invention relates to a liquid crystal display (LCD) device, and more particularly, to an array substrate for an In-Plane Switching (IPS) mode liquid crystal display device and a method for fabricating the same.

2. Discussion of the Related Art

In general, liquid crystal display (LCD) devices use optical anisotropy and polarization properties of liquid crystal molecules due to their definite orientation order in alignment resulting from their thin and long shapes. The alignment direction of the liquid crystal molecules may be controlled by application of an electric field to the liquid crystal molecules. For example, as the alignment direction of the applied electric field changes, so does the alignment of the liquid crystal molecules. Accordingly, refraction of incident light may be controlled by the orientation of the liquid crystal molecules, thereby displaying an image onto a display panel.

Presently, active matrix liquid crystal display (LCD) devices, in which the thin film transistors and the pixel electrodes are arranged in the form of a matrix, are commonly used because of their high resolution and superiority for displaying moving images. In general, a liquid crystal display (LCD) device comprises a color filter substrate having a common electrode, an array substrate having a pixel electrode, and a liquid crystal material layer between the color filter substrate and the array substrate. The liquid crystal display (LCD) device drives the liquid crystal material by controlling application an electric field between the common electrode and the pixel electrode. However, since viewing angle properties of this type of liquid crystal display (LCD) device are relatively poor, new types of liquid crystal display (LCD) devices have been developed. For example, In-Plane Switching (IPS) mode liquid crystal display (LCD) devices have been developed that have superior viewing angle properties.

FIG. 1 is a plan view of an array substrate pixel for an in-plane switching (IPS) mode liquid crystal display (LCD) device according to the related art. In FIG. 1, a plurality of gate lines 12 are formed along a first direction on the substrate 10, a storage line 16 is formed along the first direction adjacent to the gate line 12 on the substrate 10, and a plurality of data lines 30 are formed along a second direction on the substrate 10. Intersections between each of the gate lines 12 and the data lines 30 defines a pixel region "P," and a thin film transistor "T" is formed at each of the intersections of the gate lines 12 and the data lines 30. The thin film transistor "T" has a gate electrode 14, a semiconductor layer 22, a source electrode 26, and a drain electrode 28. The gate electrode 14 is connected to the gate line 12, and the source electrode 26 is connected to the data line 30. A semiconductor line 24 extends from the semiconductor layer 22 and is formed under the data line 30. A pixel electrode 36 (36a, 36b and 36c) is formed within the pixel region "P" and is connected to the drain electrode through a contact hole 34. A common electrode 18 (18a and 18b) is also formed within the pixel region "P" and is connected to the storage line 16.

The pixel electrode 36 comprises a first horizontal portion 36a, a plurality of vertical portions 36b, and a second horizontal portion 36c. The first horizontal portion extends from the drain electrode 28 and the vertical portions 36b vertically extend from the first horizontal portion 36a and are spaced apart from each other. The second horizontal portion 36c connects each of the plurality of vertical portions 36b over the storage line 16. The common electrode 18 comprises a horizontal portion 18a and a plurality of vertical portions 18b. The vertical portions 18b vertically extend from the storage line 16 and are arranged within the pixel region "P" in an alternating order with the vertical portions 36b of the pixel electrode 36. The horizontal portion 18a connects each of the plurality of vertical portions 18b.

A storage capacitor $C_{St}$ connected in parallel to the pixel electrode 36 is formed over the storage line 16. The storage capacitor $C_{St}$ comprises a first storage electrode and a second storage electrode, wherein a part of the storage line 16 serves as the first storage electrode and the second horizontal portion 36c of the pixel electrode serves as the second storage electrode. In addition, a spaced region "S" is formed between the data line 30 and the vertical portion 18b of the common electrode. Accordingly, since an abnormal electric field is generated within the spaced region "S," molecules of liquid crystal material do not function properly within a region adjacent to the spaced region "S." Thus, light leakage may occur within the region adjacent to the spaced region "S." Therefore, a black matrix is necessarily formed on an upper substrate (not shown) to prevent the light leakage by blocking the region adjacent to the spaced region "S".

FIG. 2 is a cross-sectional view along II—II of FIG. 1 according to the related art. In FIG. 2, the vertical portions 18b of the common electrode are formed along both sides of the data line 30. Accordingly, the spaced regions "S" are formed between the vertical portions 18b and the data line 30, and a black matrix 42 is formed beneath the upper substrate 40. However, if there is an alignment error when the upper and the lower substrates 40 and 10 are attached together, the black matrix 42 may fail to block the entire spaced region "S," and light leakage may occur within the spaced region "S".

FIGS. 3A to 3E are cross-sectional views taken along a line III—III of FIG. 1 and illustrating a fabricating sequence of an array substrate according to the related art, and FIGS. 4A to 4E are cross-sectional views along IV—IV of FIG. 1, and illustrate another fabrication sequence of an array substrate according to the related art. In FIGS. 3A and 4A, a gate electrode 14, as well as the gate line 12, the storage line 16, and the horizontal and vertical portions 18a and 18b of the common electrode of FIG. 1, are formed on the substrate 10 by depositing one or two of conductive metal material, such as aluminum (Al), aluminum alloys, tungsten (W), copper (Cu), molybdenum (Mo), chromium (Cr), tantalum (Ta), and titanium (Ti), and then patterned. Generally, a metal material having a low resistivity such as aluminum (Al) or aluminum alloys (AlNd), for example, is used for the gate electrode 14 to prevent signal delay. However, since aluminum-based metal materials are prone to chemical corrosion and have weak physical strength, chromium (Cr) or molybdenum (Mo) may first be deposited on the aluminum-based metal materials. A first insulating layer 20, commonly referred to as a gate insulating layer, is subsequently formed on an entire surface of the substrate 10 upon which the gate line 12, the storage line 16, and the vertical portion 18b of the common electrode are already formed.

FIGS. 3B and 4B show laminated structures of the array substrate after a second mask process according to the related art. A semiconductor layer 22 and a semiconductor line 24 are formed on the first insulating layer 20. The semiconductor layer 22 has an active layer 22a and an ohmic contact layer 22b formed over the gate electrode 14, and the semiconductor layer 22 extends to a data line area "DL" to form the semiconductor line 24. The active layer 22a is formed of amorphous silicon (a-Si:H), and the ohmic contact layer 22b is formed of impurity-doped amorphous silicon ($n^+$a-Si:H).

FIG. 3C and FIG. 4C show laminated structures of the array substrate after a third mask process according to the related art. Source and drain electrodes 26 and 28 and a data line 30 are each formed on the semiconductor layer 22 by depositing one of a conductive metal material, such as aluminum (Al), aluminum alloys, tungsten (W), copper (Cu), molybdenum (Mo), chromium (Cr), tantalum(Ta), and titanium (Ti), and then patterning it. The source electrodes 26 and the drain electrode 28 are spaced apart from each other and the data line 30 extends from the source electrode 26.

FIG. 3D and FIG. 4D show laminated structures of the array substrate after a fourth mask process according to the related art. A passivation layer 32 is formed on the entire surface of the substrate 10 by coating organic insulating material, such as benzocyclobutene (BCB) or acrylic resin, or by depositing inorganic insulating materials, such as silicon nitride (SiNx) or silicon oxide ($SiO_2$). The passivation layer 32 is then patterned to form a drain contact hole 34 to expose a portion of the drain electrode 28.

FIG. 3E and FIG. 4E show laminated structures of the array substrate after a fifth mask process according to the related art. The first horizontal portion 36a, the vertical portion 36b, and the second horizontal portion 36c of the pixel electrode are formed by depositing a transparent conductive metal material, such as indium tin oxide (ITO) and indium zinc oxide (IZO), on the passivation layer 32, and then patterning it. The first horizontal portion 36a contacts the exposed portion of the drain electrode 28 and extends into the pixel region "P" (in FIG. 1). The vertical portions 36b extend from the first horizontal portion 36a and are arranged in an alternating pattern with the vertical portions 18b of the common electrode. The second horizontal portion 36c (in FIG. 1) is disposed over the storage line 16 and interconnects each of the plurality of vertical portions 36b.

The in-plane switching (IPS) mode liquid crystal display (LCD) device fabricated using the above-described process suffers from the light leakage problem described with respect to FIG. 2. Moreover, the process for fabricating the array substrate is relatively complex, whereby production yield decreases.

SUMMARY OF THE INVENTION

Accordingly, the present invention is directed to an array substrate for in-plane switching (IPS) mode liquid crystal display (LCD) device that substantially obviates one or more of problems due to limitations and disadvantages of the related art.

An object of the present invention is to provide an array substrate for in-plane switching (EPS) mode liquid crystal display (LCD) device in which light leakage is prevented.

Another object of the present invention is to provide a method for manufacturing the array substrate for the in-plane switching (IPS) mode liquid crystal display (LCD) device in which light leakage is prevented.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an array substrate for an in-plane switching (IPS) mode liquid crystal display (LCD) device includes a gate line formed along a first direction on a substrate, a storage line formed along the first direction on the substrate and spaced apart from the gate line, a data line formed along a second direction on the substrate, the data line defining a pixel region by crossing the gate line, a thin film transistor at a crossing of the gate line and the data line, the thin film transistor having a gate electrode, a semiconductor layer, a source electrode, and a drain electrode, a pixel electrode connected to the drain electrode, a common electrode having a plurality of vertical portions connected to the storage line, the common electrode having outermost vertical portions adjacent and parallel to the data line and spaced apart from the pixel electrode, and a semiconductor line beneath the data line and extending from the semiconductor layer to both sides of the data line to cover portions of the common electrodes adjacent to the data line.

In another aspect, a method for manufacturing an array substrate of an in-plane switching (IPS) mode liquid crystal display (LCD) device includes performing a first mask process to form a gate line, a gate electrode, a storage line, and a common electrode on a substrate, the storage line being spaced apart from the gate line and parallel to the gate line, and the common electrode extending from the storage line, forming a gate insulating layer, an amorphous silicon layer, an impurity-doped amorphous silicon layer, and a metal layer sequentially on an entire surface of the substrate, performing a second mask process to form a source electrode, a drain electrode, a data line, a semiconductor layer, and a semiconductor line by pattering the metal layer, the impurity-doped amorphous silicon layer and the amorphous silicon layer, wherein the data line crosses the gate line and the storage line, the semiconductor layer is disposed beneath the source and drain electrodes, the semiconductor line is beneath the data line and extends from the semiconductor layer to both sides of the data line to cover portions of the common electrodes adjacent to the data line, performing a third mask process to form a passivation layer on an entire surface of the substrate and to form a contact hole that exposes a portion of the drain electrode by pattering the passivation layer, and performing a fourth mask process to form a transparent pixel electrode connected to the drain electrode and spaced apart from the common electrode.

In another aspect, an array substrate for an in-plane switching (IPS) mode liquid crystal display (LCD) device includes a gate line formed along a first direction on a substrate, a storage line formed along the first direction on the substrate and spaced apart from the gate line, a data line formed along a second direction on the substrate, the data line defining a pixel region by crossing the gate line, a thin film transistor at a crossing of the gate line and the data line, the thin film transistor having a gate electrode, a semiconductor layer, a source electrode, and a drain electrode, a pixel electrode connected to the drain electrode, a common electrode having a plurality of vertical portions connected to the storage line, the common electrode having outermost vertical portions adjacent and parallel to the data line, the outermost vertical portions adjacent to the data line extend to partially overlap with a portion of the data line.

In another aspect, a method for manufacturing an array substrate of an in-plane switching (IPS) mode liquid crystal display (LCD) device includes performing a first mask process on a substrate to form a gate line, a gate electrode, a storage line spaced apart from and parallel to the gate line, and a common electrode having a plurality of vertical portions vertically extending from the storage line and partially overlap with a portion of the data line, forming a gate insulating layer, an amorphous silicon layer, an impurity-doped amorphous silicon layer, and a metal layer sequentially on an entire surface of the substrate, performing a second mask process to form a source electrode, a drain electrode, a data line, a semiconductor layer, and a semiconductor line by pattering the metal layer, the impurity-doped amorphous silicon layer, and the amorphous silicon layer, the data line partially overlaps the vertical portions of the common electrode, the semiconductor layer is disposed beneath the source and drain electrodes, the semiconductor line is disposed beneath the data line and extends from the semiconductor layer, performing a third mask process to form a passivation layer on an entire surface of the substrate and a contact hole that exposes a portion of the drain electrode by pattering the passivation layer, and performing a fourth mask process to form a transparent pixel electrode connected to the drain electrode and spaced apart from the common electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiment of the present invention, which is illustrated in the accompanying drawings.

Figure 1:
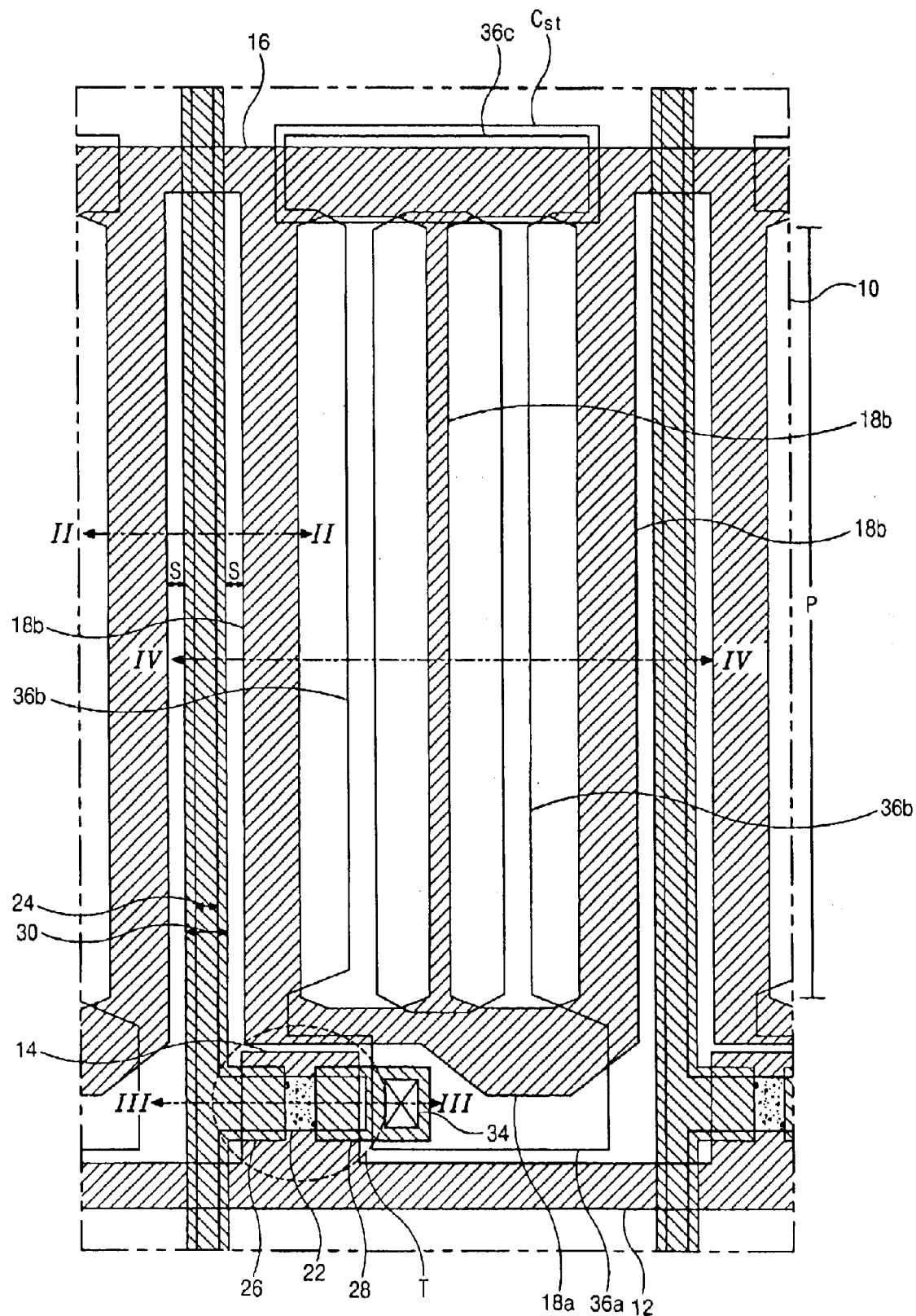
FIG. 1 is a plan view of an array substrate pixel for an in-plane switching (IPS) mode liquid crystal display (LCD) device according to the related art.
Figure 2:
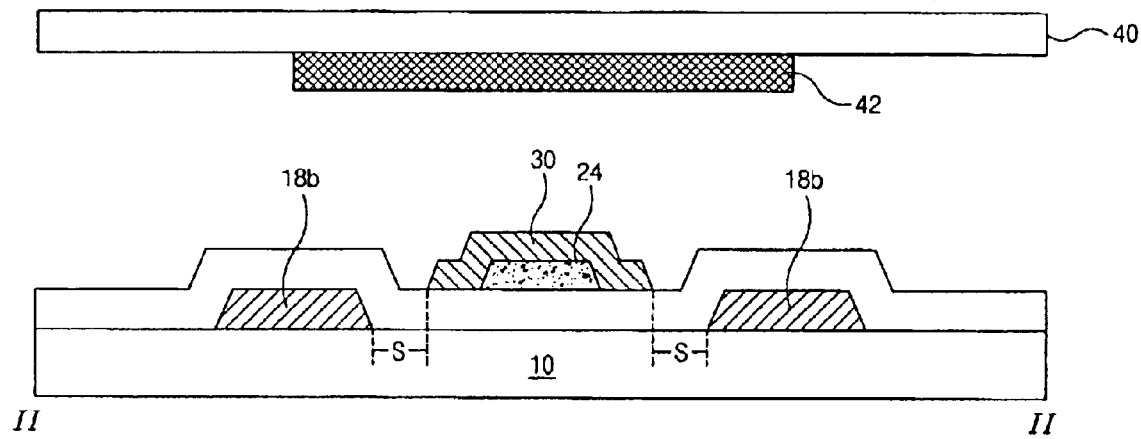
FIG. 2 is a cross-sectional view along II—II of FIG. 1 according to the related art.
Figure 3A:
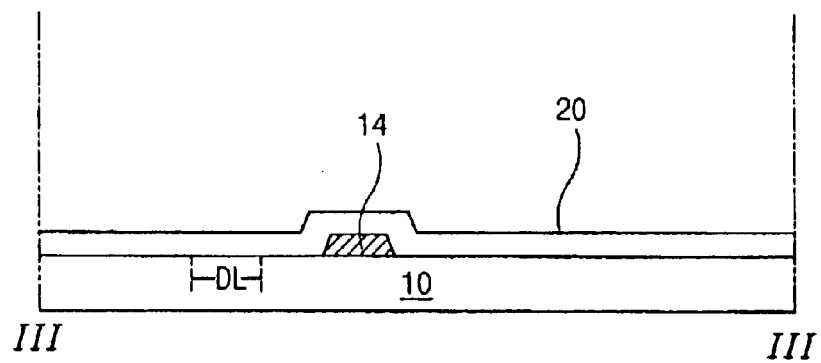
FIGS. 3A to 3E are cross-sectional views along III—III of FIG. 1, and illustrate a fabrication sequence of an array substrate according to the related art.
Figure 3B:
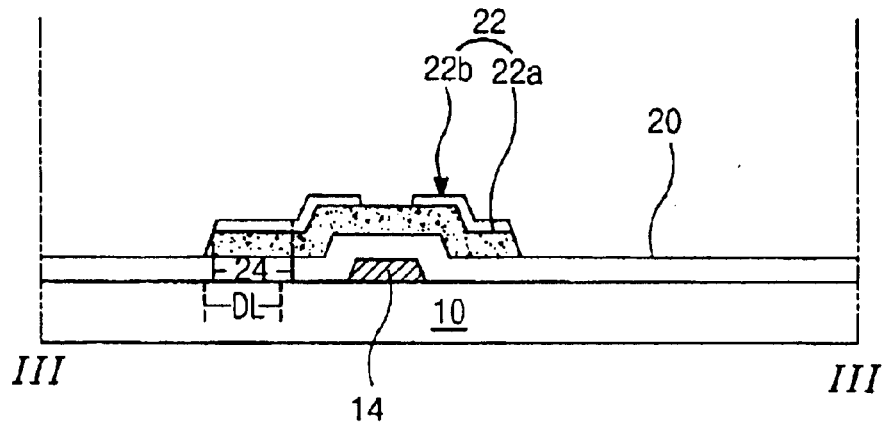
Figure 3C:
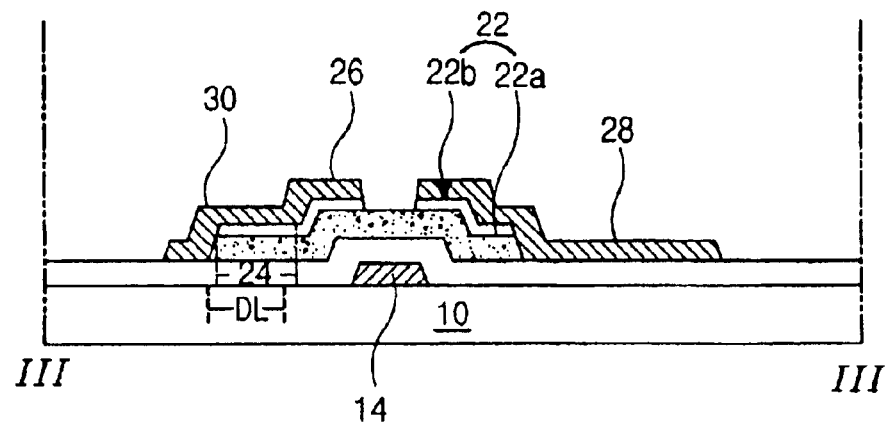
Figure 3D:
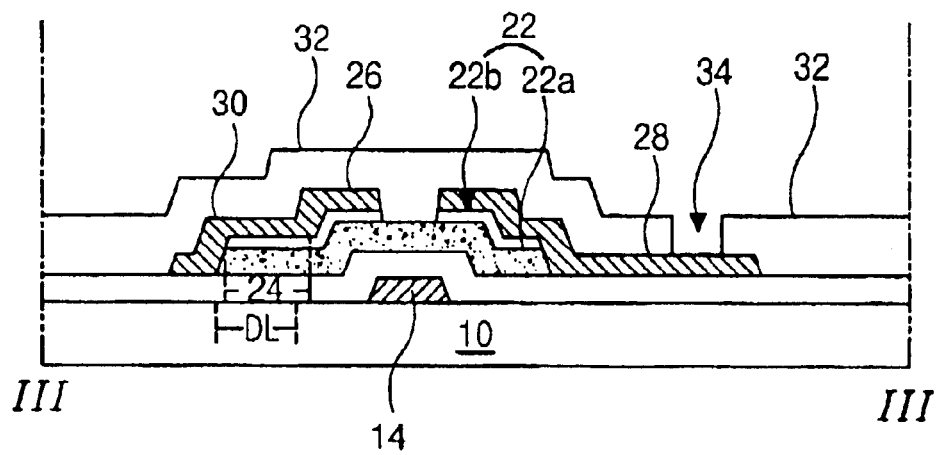
Figure 3E:
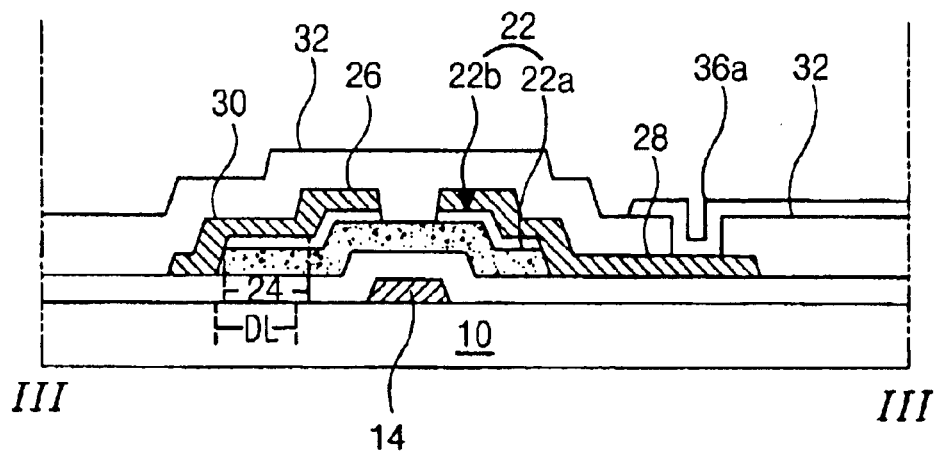
Figure 4A:
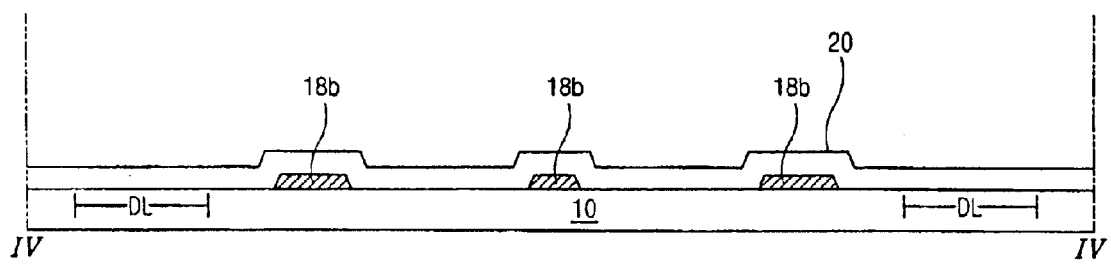
FIGS. 4A to 4E are cross-sectional views along IV—IV of FIG. 1, and illustrate another fabrication sequence of an array substrate according to the related art.
Figure 4B:
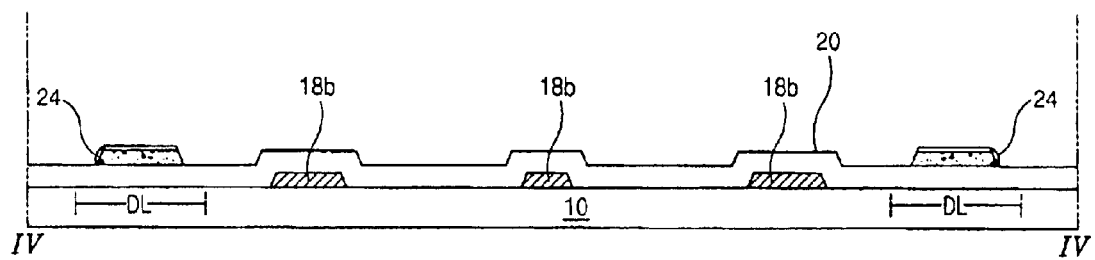
Figure 4C:
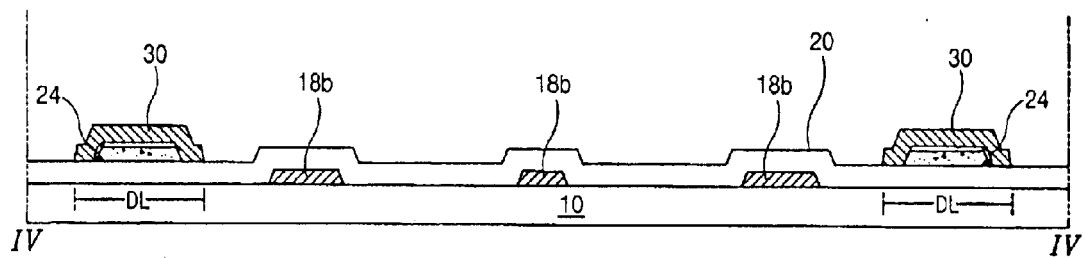
Figure 4D:
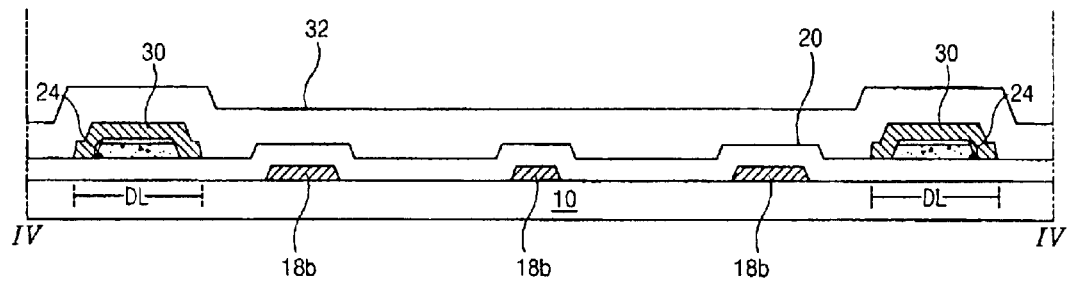
Figure 4E:
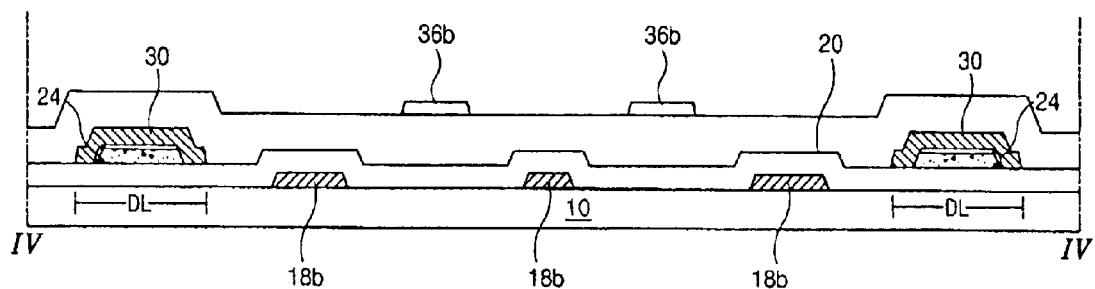
Figure 5:
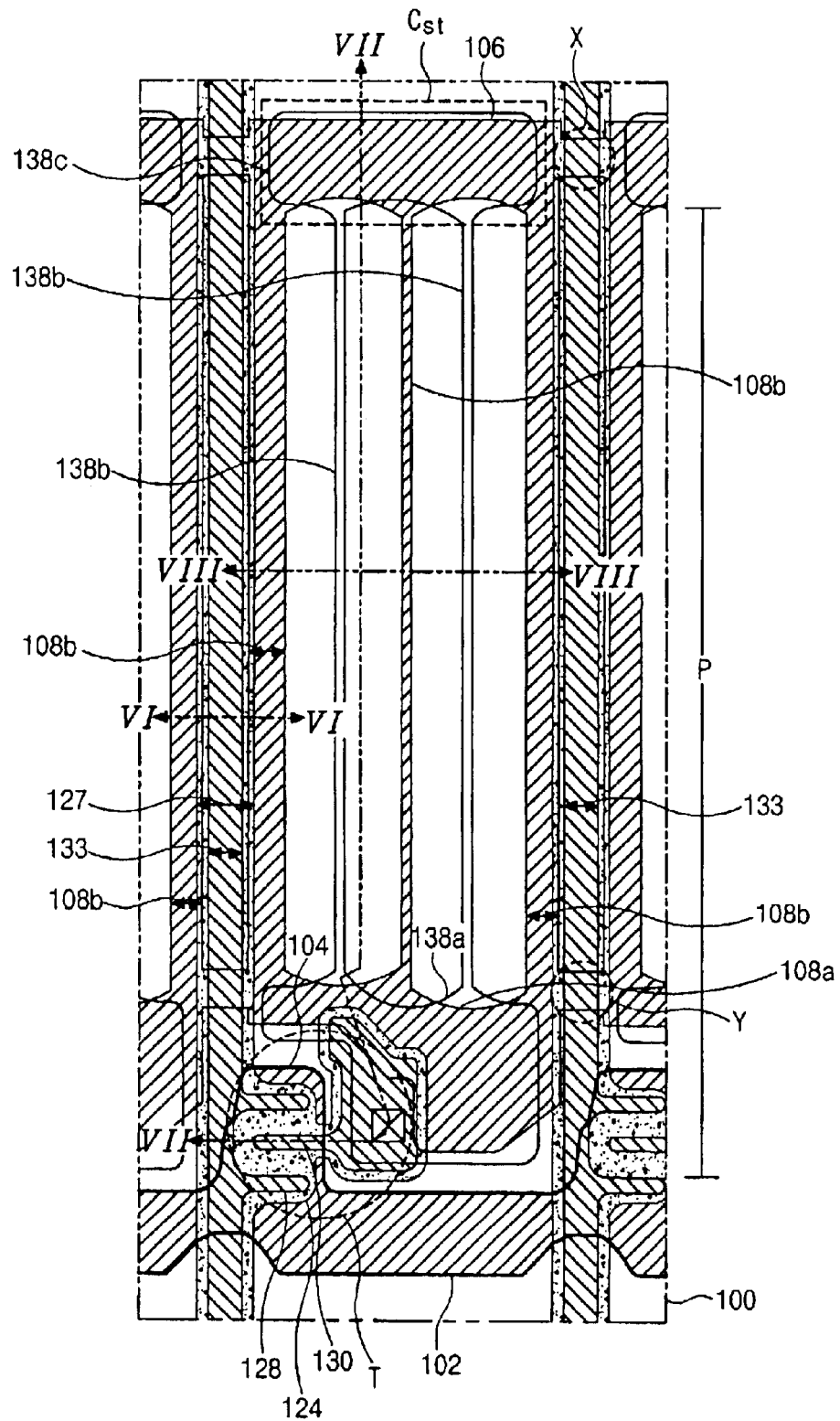
FIG. 5 is a plan view of an exemplary pixel of an array substrate for an in-plane switching (IPS) mode liquid crystal display (LCD) device according to the present invention.

FIG. 5 is a plan view of an exemplary pixel of an array substrate for an in-plane switching (IPS) mode liquid crystal display (LCD) device according to the present invention. In FIG. 5, a plurality of gate lines 102, a storage line 106, and a plurality of data lines 133 may be formed on an array substrate 100. The gate lines 102 and the storage line 106 may be formed along a first direction on the array substrate 100, and the data lines 133 may be formed along a second direction on the array substrate 100. For example, the data lines 133 may cross the gate lines 102 and the storage line 106. A thin film transistor "T" may be formed at a crossing of each of the gate lines 102 and the data lines 133. The thin film transistor "T" may include a gate electrode 104, a semiconductor layer 124, a source electrode 128, and a drain electrode 130. The gate electrode 104 may be connected to the gate line 102, and the source electrode 128 may be connected to the data line 133. The semiconductor layer 124 may extend under the source electrode 128 and the data line 133 to form a semiconductor line 127. The semiconductor line 127 may improve bonding properties of the data line 133. A pixel electrode 138 and a common electrode 108 may be formed within a pixel region "P." The pixel electrode 138 may be formed of transparent materials, and may be connected to the drain electrode 130 through a contact hole. The common electrode 108 may include a horizontal portion 108a and a plurality of vertical portions 108b. The vertical portions 108b may vertically extend from the storage line 106, and the horizontal portion 108a may interconnects each of the vertical portions 108b. The vertical portion 108b of the common electrode within the pixel region "P" may be connected to the vertical portion 108b of the common electrode in a neighboring pixel region "P" at locations "X" and "Y" to prevent signal delay in the common electrode. The pixel electrode 138 may include a first horizontal portion 138a, a plurality of vertical portions 138b, and a second horizontal portion 138c. The first horizontal portion 138a may be connected to the drain electrode 130. The vertical portions 138b may vertically extend from the first horizontal portion 138a and may be arranged in an alternating pattern with the vertical portions 108b of the common electrode. The second horizontal portion 138c may be disposed over the storage line 106 and may interconnect each of the vertical portions 138b. Accordingly, the second horizontal portion 138c of the pixel electrode and the storage line 106 may combine to form a storage capacitor $C_{St}$. A portion of the storage line 106 may function as a first storage electrode, and the second horizontal portion 138c of the pixel electrode may function as a second storage electrode.

Figure 6:
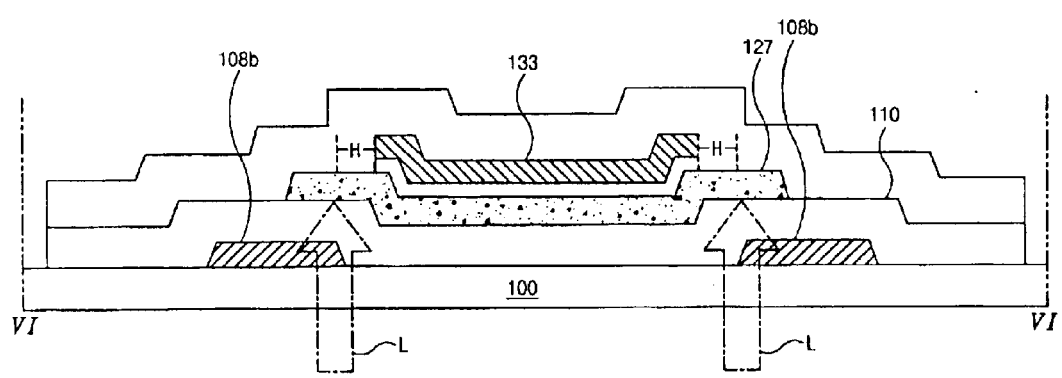
FIG. 6 is cross-sectional view along VI—VI of FIG. 5 according to the present invention.

FIG. 6 is cross-sectional view along VI—VI of FIG. 5 according to the present invention. In FIG. 6, the vertical portion 108b of the common electrode may be formed on the substrate 100, and a gate insulating layer 110 may be formed on an entire surface of the substrate 100. The semiconductor line 127 may be formed on the gate insulating layer 110, and the data line 133 may be formed on the semiconductor line 127. The semiconductor line 127 may extend to cover a portion of the vertical portion 108b of the common electrode, thereby blocking spaced regions "H" between the vertical portions 108b and the data line 133. Accordingly, since most of the light "L" that is irradiated from a back light positioned under the substrate 100 to the spaced region "H" is absorbed by the extended semiconductor line 127, light leakage may be reduced and display quality may be improved. A fabrication sequence of the array substrate for the liquid crystal display (LCD) device according to the first embodiment of the present invention will be described hereinafter with reference to FIGS. 7A to 7G and FIGS. 8A to 8G.

FIGS. 7A to 7G are cross-sectional views along VII—VII of FIG. 5, and illustrate an exemplary fabrication sequence of an array substrate according to the present invention, and FIGS. 8A to 8G are cross-sectional views along VIII—VIII of FIG. 5 and illustrate an exemplary fabrication sequence of an array substrate according to the present invention.

Figure 7A:
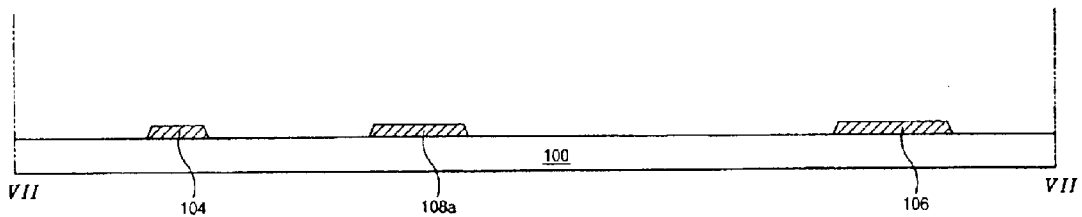
FIGS. 7A to 7G are cross-sectional views along VII—VII of FIG. 5, and illustrate an exemplary fabrication sequence of an array substrate according to the present invention.
Figure 8A:
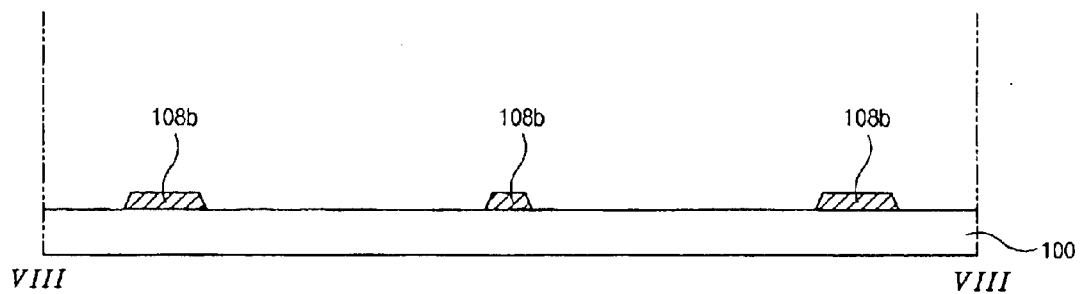
FIGS. 8A to 8G are cross-sectional views along VIII—VIII of FIG. 5 and illustrate an exemplary fabrication sequence of an array substrate according to the present invention.

FIG. 7A and FIG. 8A are cross-sectional views illustrating laminated structures of the array substrate after an exemplary first mask process according to the present invention. In FIGS. 7A and 8A, the gate electrode 104, as well as the storage line 106, the common electrode 108, and the gate line 102 in FIG. 5, is formed by depositing one or more conductive metal materials, such as aluminum (Al), aluminum alloys, tungsten (W), copper (Cu), molybdenum (Mo), chromium (Cr), tantalum (Ta), and titanium (Ti), on the substrate 100, and then patterning it. The gate line 102 (in FIG. 5) may be formed along a first direction and may be connected to the gate electrode 104. The storage line 106 may be formed adjacent to the gate line 102 (in FIG. 5) and may be formed parallel to the gate line 102 (in FIG. 5). The common electrode 108 may extend from the storage line 106 and may include a horizontal portion 108a and a plurality of vertical portions 108b. The vertical portions 108b may vertically extend from the storage line 106, and the horizontal portion 108a may interconnect each of the plurality of vertical portions 108b. The vertical portion 108b adjacent to a neighboring pixel may be connected to the vertical portion 108b of the common electrode of the neighboring pixel at positions "X" and "Y" (in FIG. 5). The gate line 102 (in FIG. 5) may be formed of conductive metal materials, such as aluminum (Al) or Aluminum alloys (AlNd), having a low electric resistance in order to avoid signal delay. However, since aluminum-based metals are prone to chemical corrosion and weak physical strength, chromium (Cr) or molybdenum (Mo) may first be deposited on the aluminum-based metal materials.

Figure 7B:
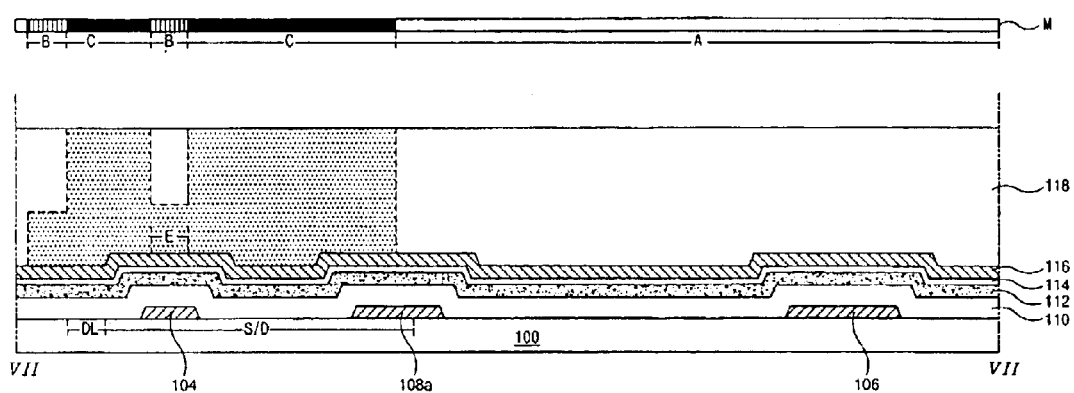
Figure 7C:
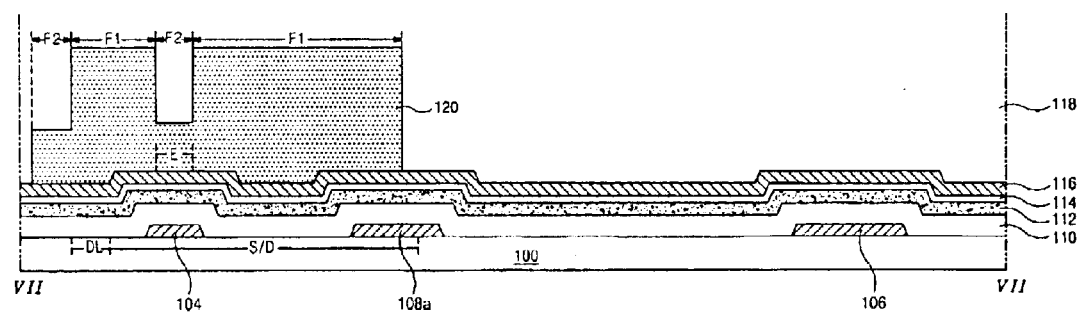
Figure 7D:
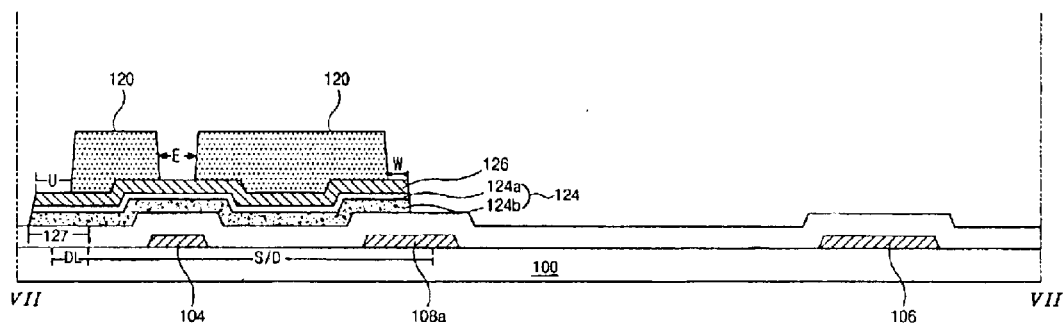
Figure 7E:
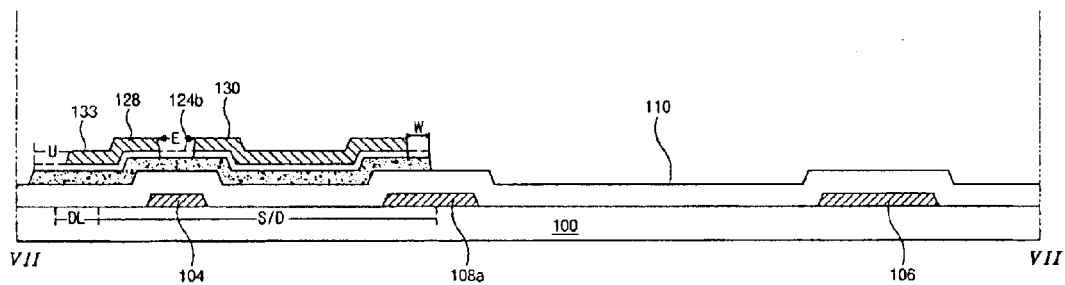
Figure 8B:
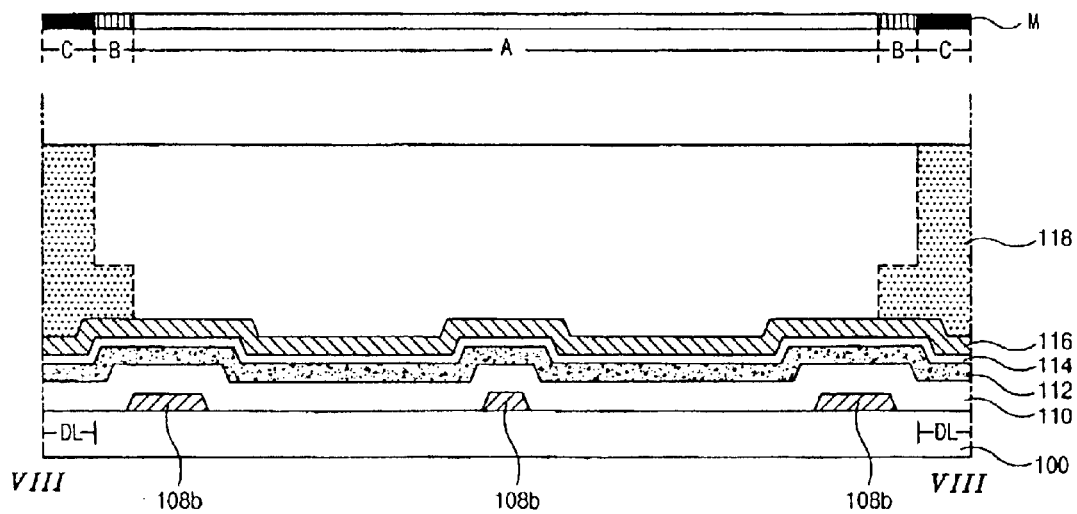

FIGS. 7B to 7E and FIGS. 8B to 8E are cross-sectional views illustrating laminated structures of the array substrate after an exemplary second mask process according to the present invention. The second mask process may be performed using a half-tone mask. In FIGS. 7B and 8B, a first insulating layer 110, i.e., a gate insulating layer, an active layer 112, an ohmic contact layer 114, and a metal layer 116 may be sequentially formed on the substrate 100 upon which the gate electrode 104, the common electrode 108, and the storage line 106 may have already been formed. The first insulating layer 110 may be formed of inorganic insulating materials, such as silicon nitride (SiNx) and silicon oxide (SiO$_2$). The active layer 112 may be formed of amorphous silicon (a-Si:H) and the ohmic contact layer 114 may be formed of impurity-doped amorphous silicon (n$^+$a-Si:H). The metal layer 116 may be formed of conductive metal materials, such as aluminum (Al), aluminum alloys, tungsten (W), copper (Cu), molybdenum (Mo), chromium (Cr), tantalum (Ta), and titanium (Ti).

Figure 8C:
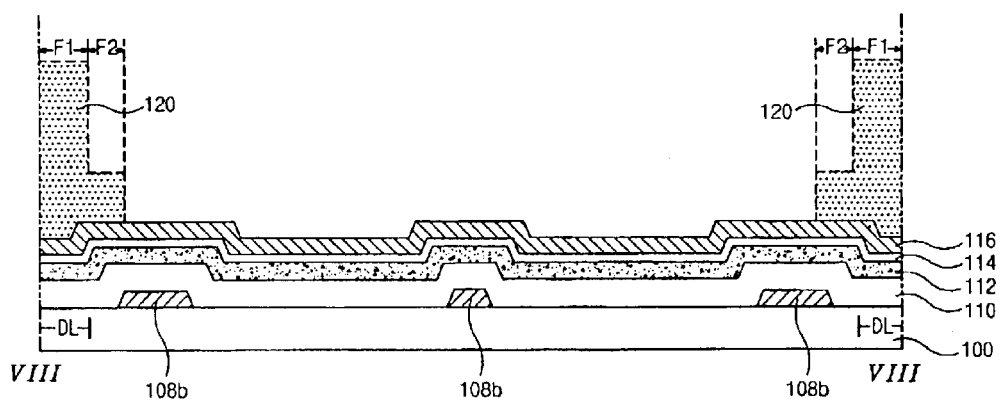

A photoresist layer 118 may subsequently be formed on the metal layer 116 by coating photoresist materials. A positive-type photoresist in which an exposed portion of the photoresist is removed may be used. For example, a mask "M" may be disposed over the substrate 100 upon which the photoresist layer 118 is formed and the light may be irradiated onto the photoresist layer 118 through the mask "M". The mask "M" may include a transmission portion "A," a semi-transmission portion "B," and a block portion "C." The semi-transmission portion "B" may be formed by depositing a semitransparent film or pattering a designated portion of the mask "M" into a plurality of slits. The block portion "C" of the mask "M" corresponds to source and drain regions "S/D" and a data line region "DL," and the semi-transmission portion "B" of the mask "M" corresponds to spaced regions "H" between the source and drain electrode that will formed in a later process and a region on both sides of the data line region "DL." The semi-transmission portion "B" of the mask "M" may be formed to further correspond to the vertical portions 108b of the common electrode that are adjacent to the both sides of the data line region "DL." Accordingly, the semiconductor line (not shown) may be formed to extend under the data line (not shown) to cover a portion of the vertical portion 108b of the common electrode. If the photoresist layer 118 that has been exposed to the light is developed, a photoresist pattern 120 may be formed, as shown in FIGS. 7C and 8C.

Figure 8D:
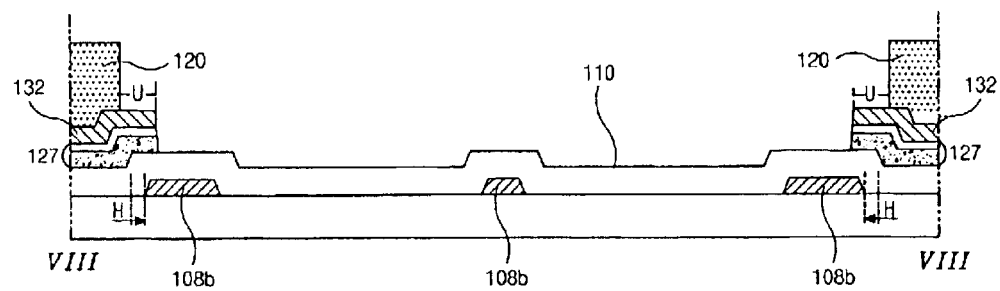

A portion "F1" of the photoresist pattern 120 corresponds to the block portion "C" of the mask "M," and a portion "F2" of the photoresist pattern 120 corresponds to the semi-transmission portion "B" of the mask "M." A portion of the photoresist layer 118 may be completely removed after development of the photoresist layer 118. A first metal pattern 126, a second metal pattern 132, a semiconductor layer 124, and the semiconductor line 127 may then be formed by etching exposed portions of a metal layer 116, and subsequently removing the impurity-doped amorphous silicon (n$^+$a-Si:H) layer 114 and the amorphous silicon (a-Si:H) layer 112, as shown in FIGS. 7D and 8D. The first metal pattern 126 may be formed over the gate electrode 104, and the second metal pattern 132 may extend from the first metal pattern 126.

The semiconductor layer 124 may include an amorphous silicon (a-Si:H) layer 124b and an impurity-doped amorphous silicon (n$^+$a-Si:H) layer 124a. The semiconductor line 127 may extend from the semiconductor layer 124 to a lower side of the second metal pattern 132. In addition, the exposed layer 116 may be removed by wet etching and the amorphous silicon layers 124a and 124b may be removed by dry etching. The photoresist pattern 120 may be removed via a subsequent ashing process. Accordingly, a portion "F2" of the photoresist pattern 120 that corresponds to the spaced portion "E" and the both sides of the data line (not shown) may be completely removed to expose a portion "U" of the metal layers 126 and 132. In addition, a region of the portion "F1" of the photoresist pattern 120 may be partially removed. Moreover, a portion of the photoresist pattern 120 corresponding to a portion "W" of the first metal pattern 126 may also be removed during the ashing process to expose a portion of the first metal pattern 126.

Figure 8E:
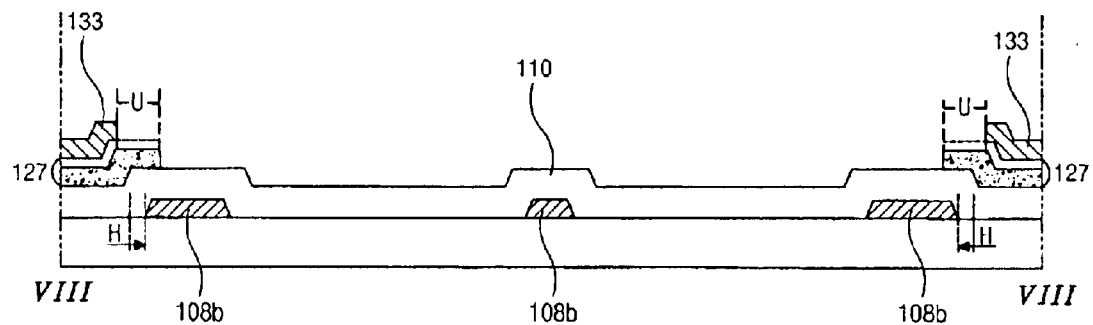

In FIGS. 7E and 8E, the source and drain electrodes 128 and 130 and the data line 133, which is connected to the source electrode 128, may be formed by etching the exposed portions of the first and second metal patterns 126 and 132. The source and drain electrodes 128 and 130 may be formed to overlap the gate electrode 104 and to be spaced apart from each other. The source electrode 128 may include a U-shape and the drain electrode 130 may be disposed within the U-shaped source electrode 128, as shown in FIG. 5. Accordingly, since the source and drain electrodes 128 and 130 shorten a length of an exposed semiconductor channel layer at a spaced region "E" between the source and drain electrodes 128 and 130 and enlarging a width thereof, operating properties of a thin film transistor may be improved.

Subsequently, the impurity-doped amorphous silicon (n⁺a-Si:H) layer 124b under both sides "U" of the data line 133 and the portions "W" and "E" of the first metal pattern 126 may be removed during the dry etching. Consequently, the semiconductor line 127, now only including the amorphous silicon (a-Si:H) layer 124b, exposed along both sides of the data line 133 extends to be overlapped with a top portion of the vertical portions 108 of the common electrode that is adjacent to the data line 133. Accordingly, the amorphous silicon (a-Si:H) layer 124b prevents light leakage within the spaced region "H" between the data line 133 and the neighboring vertical portion 108b of the common electrode. Although the extended semiconductor line 127 may not completely block the light leakage within the spaced region "H," consideration of thickness and transmission properties of the amorphous silicon (a-Si:H) material may provide for absorption of a majority of the light. Thus, the light leakage may not be sensed by an observer.

Figure 7F:
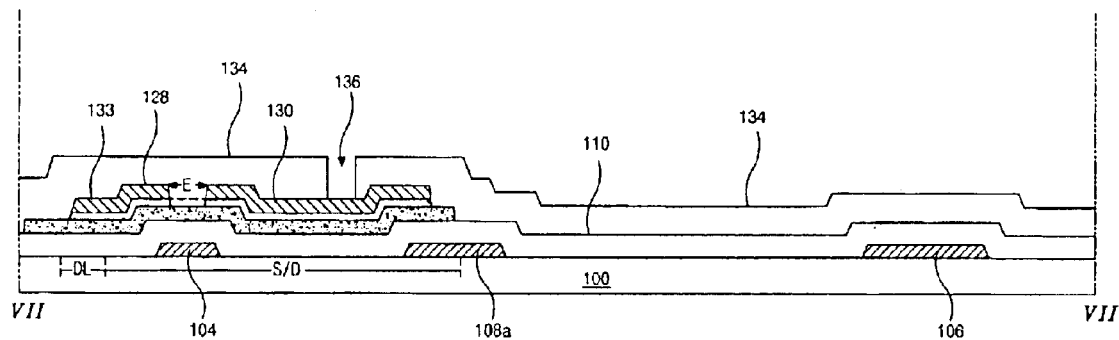
Figure 8F:
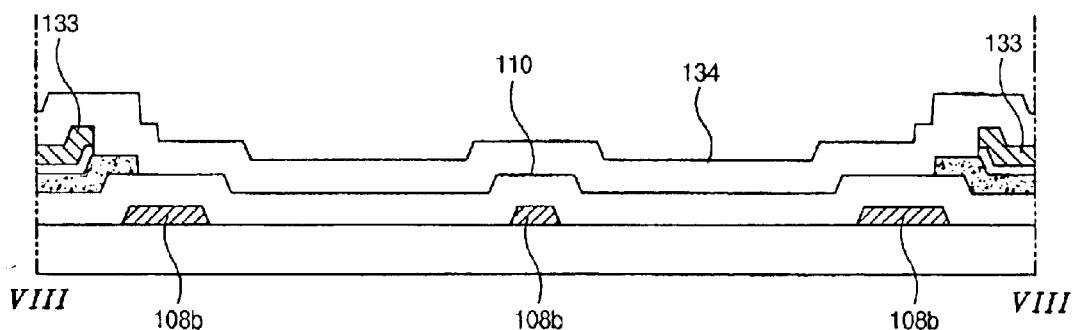

FIGS. 7F and 8F are cross-sectional views illustrating laminated structures of the array substrate after an exemplary third mask process according to the present invention. In FIGS. 7F and 8F, a passivation layer 134 may be formed by depositing organic insulating materials, such as benzocyclobutene (BCB) and acrylic resin, onto an entire surface of the substrate 100 upon which the source and drain electrodes 128 and 130 and the data line 133 are already formed. Then, the passivation layer 134 may be patterned to form a drain contact hole 136 that exposes a portion of the drain electrode 130.

Figure 7G:
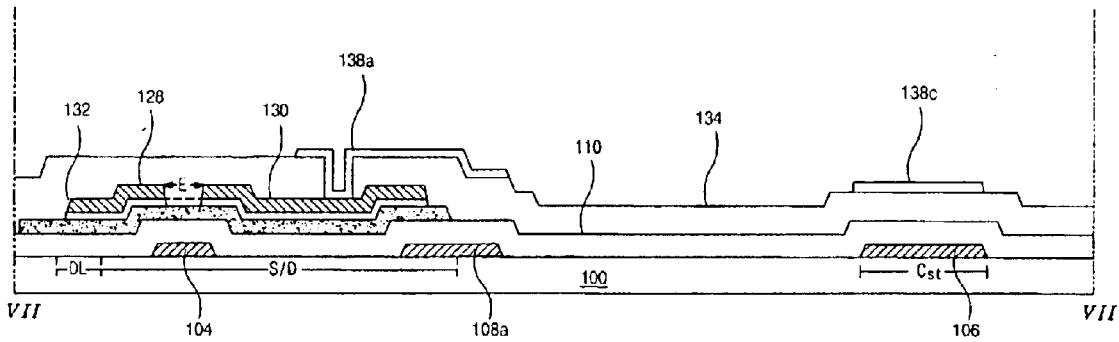
Figure 8G:
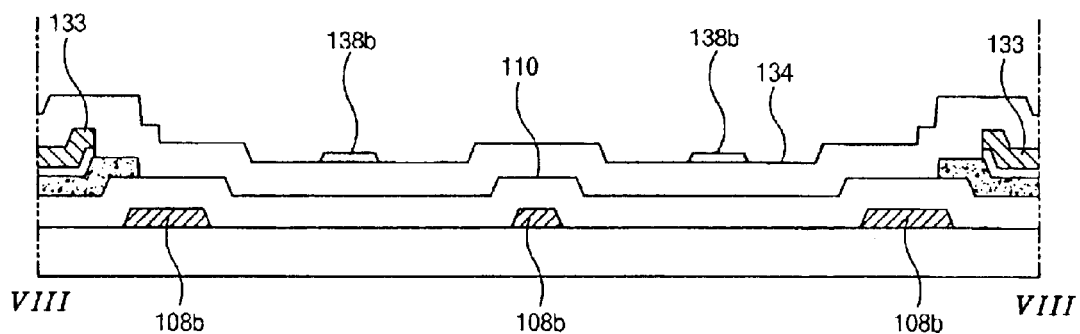

FIGS. 7G and 8G are cross-sectional views illustrating laminated structures of the array substrate after an exemplary fourth mask according to the present invention. In FIGS. 7G and 8G, a pixel electrode 138 including a first horizontal portion 138a, a plurality of vertical portions 138b, and a second horizontal portion 138c may be formed by depositing transparent conductive metal materials, such as indium tin oxide (ITO) and indium zinc oxide (IZO), onto an entire surface of the substrate 100 upon which the passivation layer 134 is already formed. The first horizontal portion 138a of the pixel electrode 138 may contact the drain electrode 130 and may extend to the pixel region "P" (in FIG. 5). The vertical portions 138b of the pixel electrode may vertically extend from the first horizontal portion 138a and may be arranged in an alternating pattern with the vertical portions 108b of the common electrode 108. The second horizontal portion 138c may be disposed over the storage line 106 and may interconnect each of the plurality of vertical portions 138b. The second horizontal portion 138c and a portion of the storage line 106 may combine to form a storage capacitor $C_{St}$ using the storage line as a first storage electrode and the second horizontal portion 138c as a second storage electrode. Consequently, the array substrate of the in-plane switching (IPS) mode liquid crystal display (LCD) device according to the above-described process.

In FIGS. 7B and 8B, the semi-transmission portion "B" corresponding to both sides of the data line 133 is used in the above-described exemplary fabrication process to form the extended semiconductor line 127 from the data line 133 to the vertical portion 108b of the common electrode. Alternatively, the extended semiconductor line 127 may be formed during a 4-mask process, wherein a lateral portion of the photoresist layer may be etched away during the etching process. An addition method to block the spacer portions "H" between the data line 133 and the vertical portion 108b of the common electrode may include extending the vertical portion 108 of the common electrode that is adjacent to the data line 133 to a lower side of the data line 133. A second embodiment of the present invention is about this method.

The second embodiment of the present invention will be described hereinafter with reference to attached figures.

Figure 9:
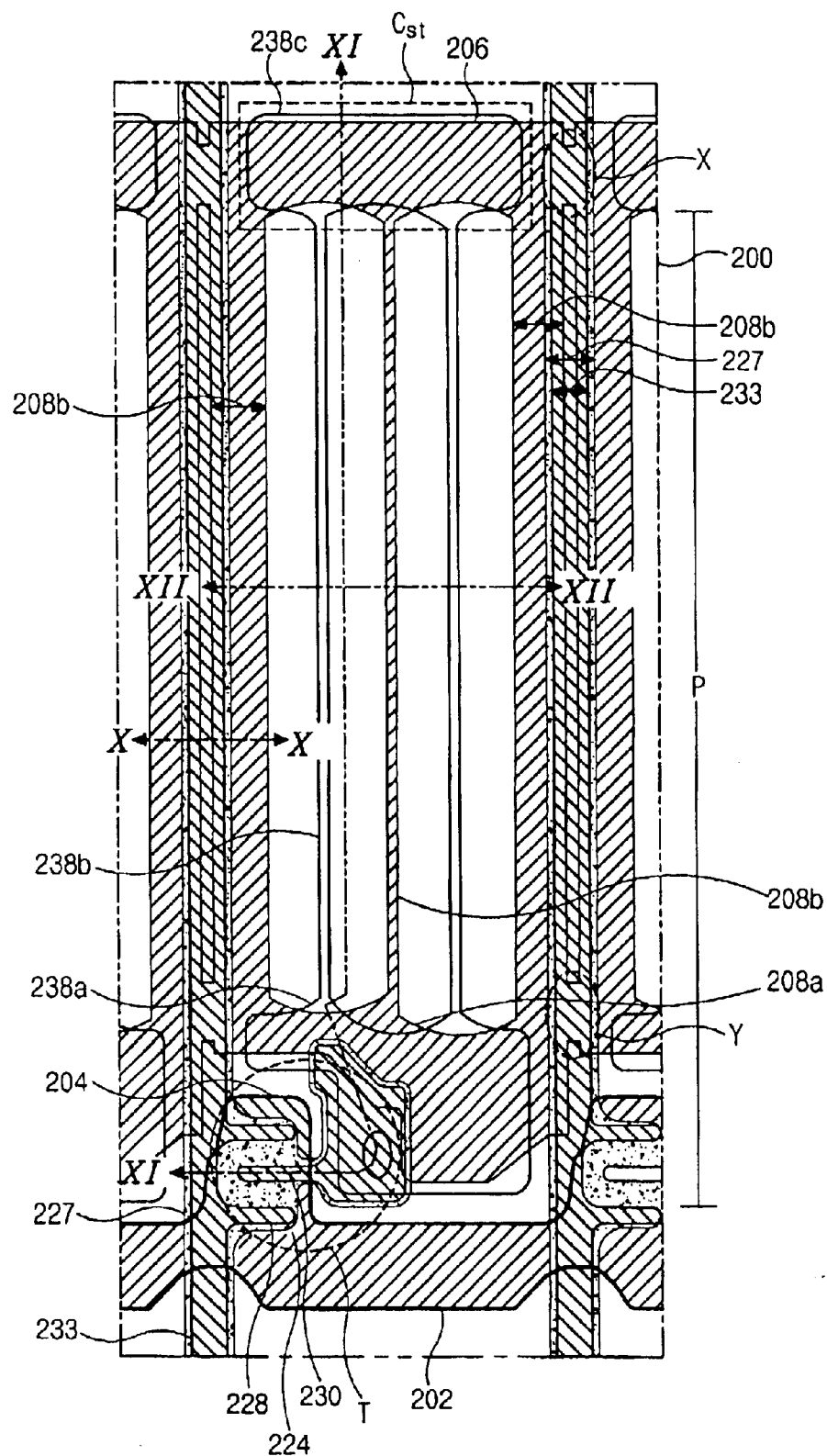
FIG. 9 is a plan view of a pixel of an array substrate for an in-plane switching (IPS) mode liquid crystal display (LCD) device according to the present invention.

FIG. 9 is a plan view of a pixel of an array substrate for an in-plane switching (IPS) mode liquid crystal display (LCD) device according to the present invention. In FIG. 9, a plurality of gate lines 202, a storage line 206, and a plurality of data lines 233 may be formed on the array substrate 200. The storage line 206 may be formed in parallel to the gate line 202, and a crossing of the data line 233 and the gate line 202 may define a pixel region "P." A thin film transistor "T" including a gate electrode 204, a semiconductor layer 224, a source electrode 228, and a drain electrode 230 may be formed at a crossing of the gate line 202 and the data line 233. The gate electrode 204 may be connected to the gate line 202, and the source electrode 228 may be connected to the data line 233. A semiconductor line 227 may be formed by extending the semiconductor layer 224 to a lower side of the source and drain electrodes 228 and 230, thereby improving bonding properties of the data line 233. A common electrode 208 including a horizontal portion 208a and a plurality of vertical portions 208b, and a pixel electrode having a first horizontal portion 238a, a plurality of vertical portions 238b, and a second horizontal portion 238c may be formed within the pixel region "P." The vertical portion 208b of the common electrode 208 may vertically extend from the storage line 206, and the horizontal portion 208a of the common electrode 208 may interconnect each of the plurality of vertical portions 208b. The first horizontal portion 238a of the pixel electrode 238 may be connected to the drain electrode 230 and may extend to the pixel region "P." The plurality of vertical portions 238b of the pixel electrode 238 may vertically extend from the first horizontal portion 238a of the pixel electrode 238. The second horizontal portion 238c may be disposed over the storage line 206 and may interconnect each of the plurality of vertical portions 238b of the pixel electrode. The plurality of vertical portions 238b of the pixel electrode 238 may be arranged in an alternating pattern with the vertical portions 208b of the common electrode 208. The vertical portion 208b of the common electrode 208 within the pixel region "P" may be connected to the vertical portion 208b of the common electrode 208 of the neighboring pixel region "P" at "X" and "Y." The second horizontal portion 238c may form a storage capacitor $C_{St}$ together with the storage line 206 thereunder. The storage capacitor $C_{St}$ may function my using a portion of the storage line 206 as a first storage electrode and the second horizontal portion 238c as a second storage electrode. Accordingly, the vertical portion 208b of the common electrode 208 may extend to a lower side of the data line 233 to block a spaced region between the data line 233 and the vertical portion 208b, thereby preventing light leakage within the spaced region between the data line 233 and the vertical portion 208b.

Figure 10:
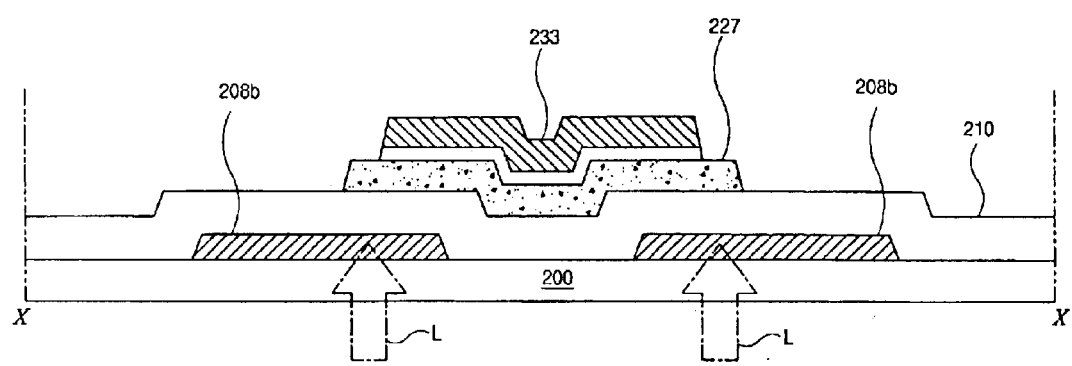
FIG. 10 is cross-sectional view along IX—IX of FIG. 9 according to the present invention.

FIG. 10 is cross-sectional view along IX—IX of FIG. 9 according to the present invention. In FIG. 10, the vertical portions 208b may be formed on a substrate 200, and a gate insulating layer 210 may be formed on an entire surface of the substrate 200 upon which the vertical portions 208b are already formed. The semiconductor line 227 and the data line 233 may be sequentially formed on the gate insulating layer 210 corresponding to a region between two vertical portions 208b. The vertical portions 208b of the common electrode under the gate insulating layer 210 may extend to a lower side of the data line 233 adjacent to the vertical portion 208b so that the vertical portion 208b of the common electrode may overlap with a portion of the data line 233. Accordingly, there may be no spaced region between the vertical portion 208b and the data line 233. Thus, the extended portion of the vertical portions 208b may prevent light leakage between the data line 233 and the vertical portions 208b by blocking a region between the data line 233 and the vertical portions 208b.

Figure 11A:
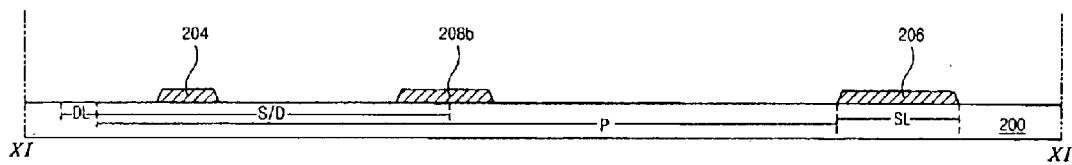
FIGS. 11A to 11G are cross-sectional views along XI—XI of FIG. 9, and illustrate another exemplary fabrication sequence of an array substrate according to the present invention.
Figure 11B:
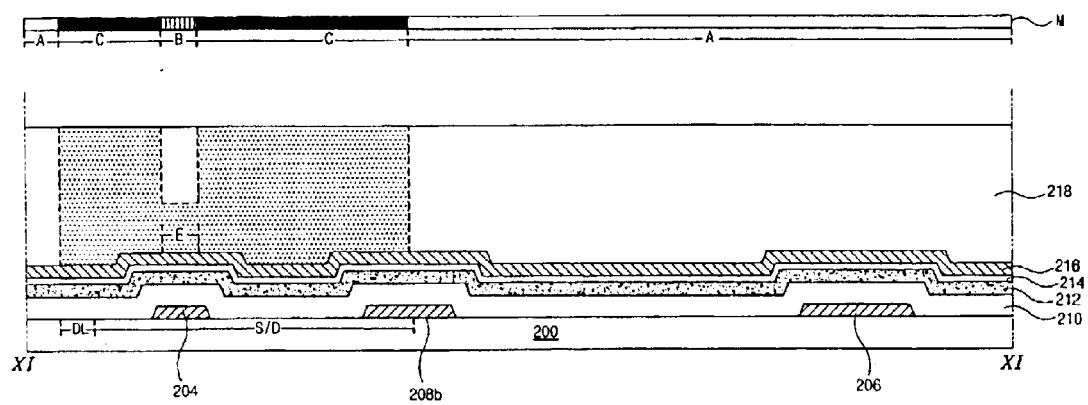
Figure 11C:
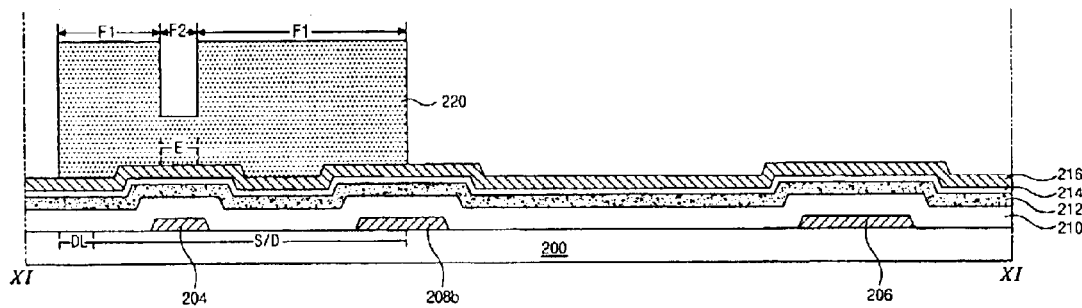
Figure 11D:
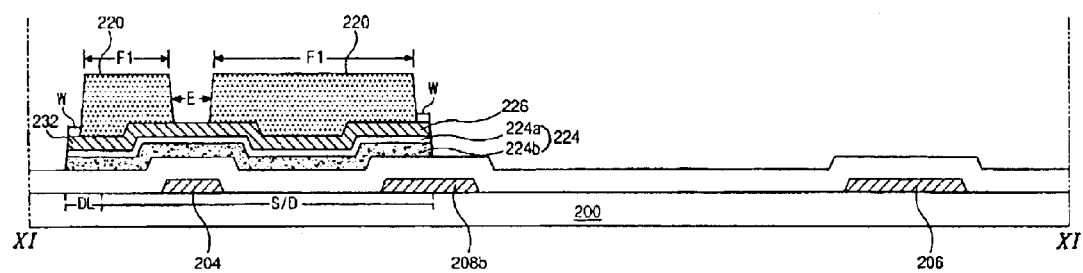
Figure 11E:
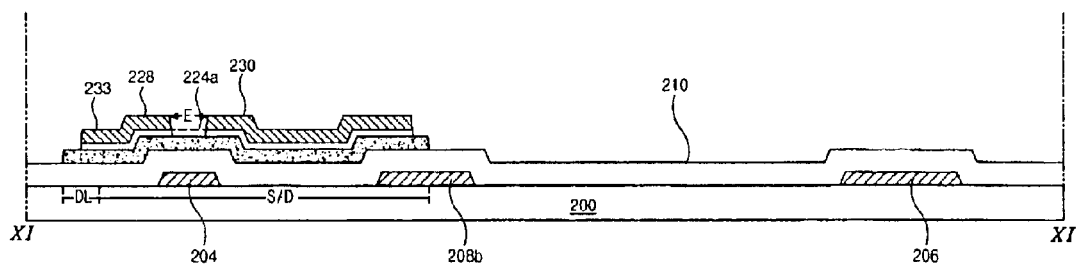
Figure 11F:
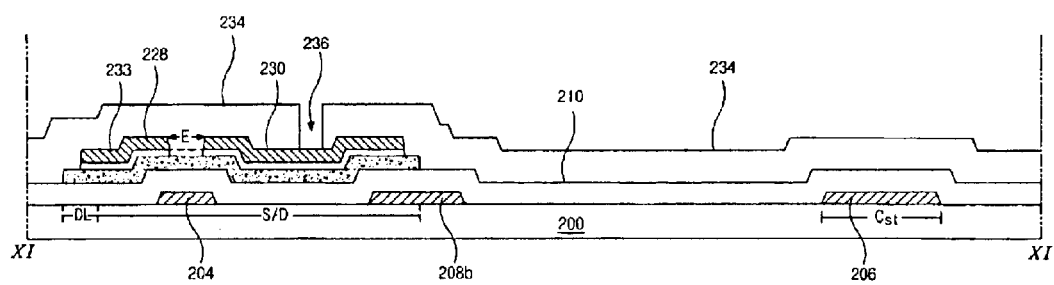
Figure 11G:
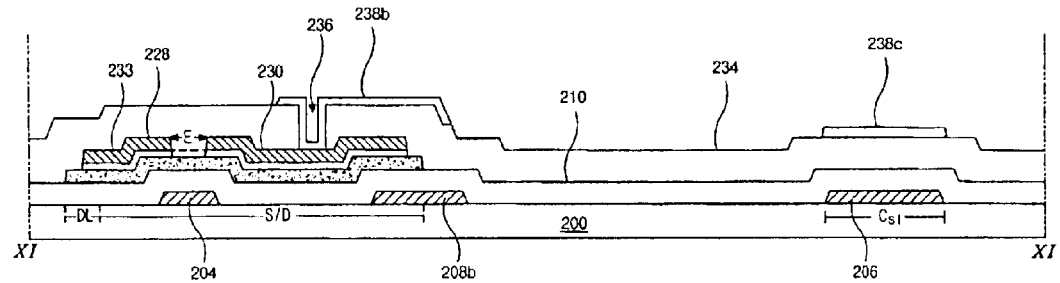
Figure 12A:
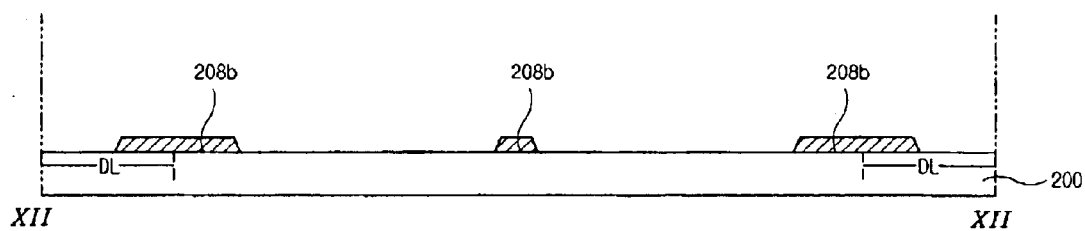
FIGS. 12A to 12G are cross-sectional views along XII—XII of FIG. 9, and illustrate another exemplary fabrication sequence of an array substrate according to the present invention.

FIGS. 11A to 11G are cross-sectional views along XI—XI of FIG. 9, and illustrate another exemplary fabrication sequence of an array substrate according to the present invention, and FIGS. 12A to 12G are cross-sectional views along XII—XII of FIG. 9, and illustrate another exemplary fabrication sequence of an array substrate according to the present invention. In FIGS. 11A and 12A, a data line region "DL," a source and drain region "S/D," a pixel region "P," a gate line region (not shown), and a storage line region "SL" may be defined on a substrate 200. A gate electrode 204, a storage line 206, a common electrode 208 including a horizontal portion 208a and a plurality of vertical portions 208b, as well as a gate line 202 (in FIG. 9), may be formed by depositing conductive metal materials, such as aluminum (Al), aluminum alloys, tungsten (W), copper (Cu), molybdenum (Mo), chromium (Cr), tantalum (Ta), and titanium (Ti), on the substrate 200, and then patterning it. The gate line 202 (in FIG. 9) may be formed along a first direction of the substrate 200 and may be connected to the gate electrode 204. The storage line 206 may be formed adjacent and parallel to the gate line 202, and the common electrode 208 may extend from the storage line 206. The common electrode 208 may include the plurality of vertical portions 208b that vertically extend from the storage line 206 and the horizontal portion 208a that interconnects each of the plurality of vertical portions 208b. The vertical portions 208b adjacent to the data line region "DL" may extend to the data line region "DL." The vertical portion 208b of the common electrode 208 within a pixel region "P" may be connected to the vertical portion 208b of the common electrode 208 of the neighboring pixel region "P" at "X" and "Y," as shown in FIG. 9. The gate line 202 (in FIG. 9) may be formed of metal materials, such as aluminum (Al) or aluminum alloys (AlNd), having low electric resistance to avoid signal delay. Accordingly, since aluminum-based metals are prone to chemical corrosion and have weak physical strength, chromium (Cr) or molybdenum (Mo) may be deposited on the aluminum-based metal materials.

Figure 12B:
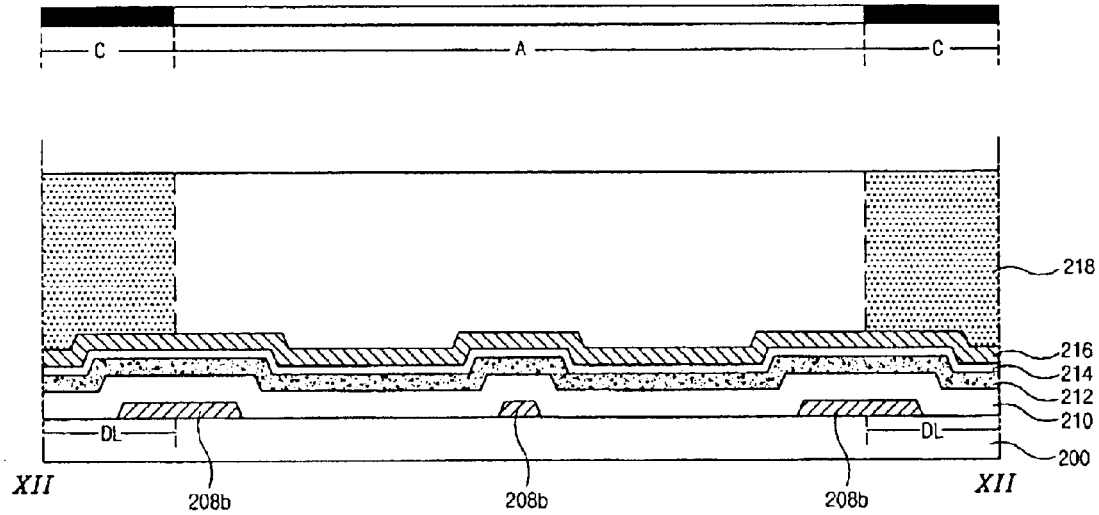

FIGS. 11B to 11E and 12B to 12E are cross-sectional views illustrating laminated structures of the array substrate after an exemplary second mask process according to the present invention. Here, the second mask process may be performed using the half-tone mask as described above. In FIGS. 11B and 12B, a first insulating layer 210, i.e., a gate insulating layer, an amorphous silicon (a-Si:H) layer 212, and impurity-doped amorphous silicon (n$^+$a-Si:H) layer 214, and a metal layer 216 may be sequentially formed on the substrate 200. The gate insulating layer 210 may be formed by depositing inorganic insulating materials, such as silicon nitride (SiNx) and silicon oxide (SiO$_2$), onto an entire surface of the substrate 200 upon which the gate line (not shown), the storage line 206, and the common electrode 208 are already formed. The metal layer 216 may be formed by depositing conductive metal materials, such as aluminum (Al), aluminum alloys, tungsten (W), copper (Cu), molybdenum (Mo), chromium (Cr), tantalum (Ta), and titanium (Ti), on the substrate 200.

A photoresist layer 218 may be formed by coating photoresist materials on the metal layer 216. A positive-type photoresist in which a portion exposed to light is removed after a development may be used for explanation. As previously described, a mask "M" having a transmission portion "A," a semi-transmission portion "B," and a blocked portion "C" may be disposed over the substrate 200, and light may be irradiated into the photoresist layer 218 through the mask "M." The blocked portion "C" of the mask "M" corresponds to the source and drain region "S/D" and the data line region "DL," and the semi-transmission portion "B" of the mask "M" corresponds to a spaced region "E" between the source electrode and the drain electrode that will be formed during a later process. In FIG. 12B, the vertical portions 208b of the common electrode 208 extend to a lower side of the blocked portion "C" of the mask "M" corresponding to the data line region "DL."

Figure 12C:
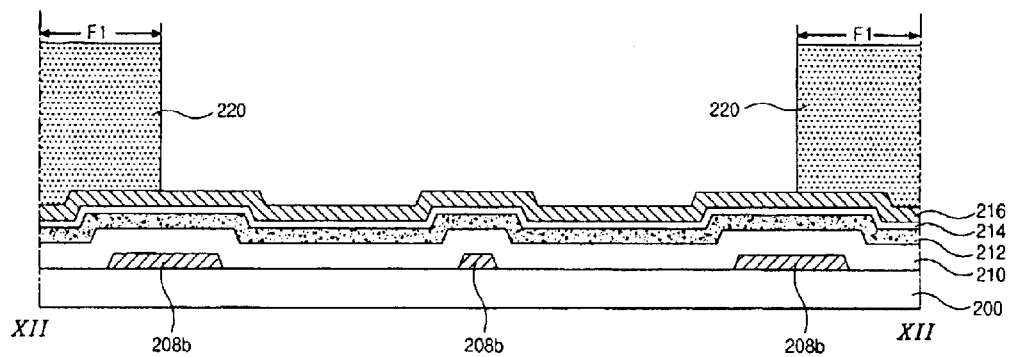
Figure 12D:
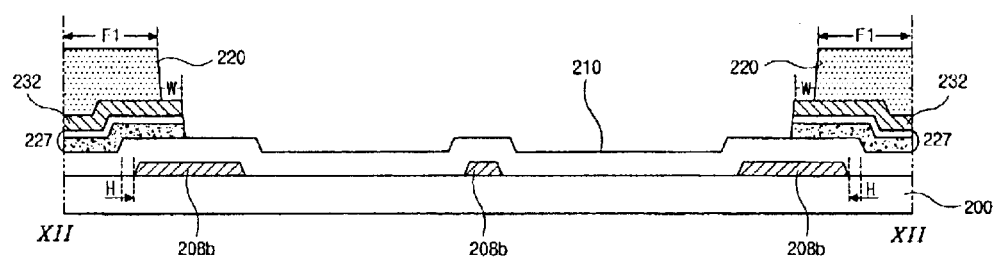

A photoresist pattern 220 may be formed by developing the photoresist layer 218 that is exposed to the light, as shown in FIGS. 11C and 12C. In FIGS. 11C and 12C, a portion "F1" of the photoresist pattern 220 corresponds to the blocked portion "C" of the mask "M" and a portion "F2" of the photoresist pattern 220 corresponds to the semi-transmission portion "B" of the mask "M." A portion of the photoresist layer 218 corresponding to the transmission portion "A" of the mask "M" may be completely removed. A first metal pattern 226, a second metal pattern 232, a semiconductor layer 224, and the semiconductor line 227 may be formed by etching exposed portions of a metal layer 216, and subsequently removing portions of the impurity-doped amorphous silicon (n$^+$a-Si:H) layer 214 and the amorphous silicon (a-Si:H) layer 212, as shown in FIG. 11D and FIG. 12D. The first metal pattern 226 may be formed over the gate electrode 204, and the second metal pattern 232 may extend from the first metal pattern 226.

The semiconductor layer 224 may include an amorphous silicon (a-Si:H) layer 224b and an impurity-doped amorphous silicon (n$^+$a-Si:H) layer 224a. The semiconductor line 227 may extend from the semiconductor layer 224 to a lower side of the second metal pattern 232. The amorphous silicon (a-Si:H) layer 224b may function as an active layer and the impurity-doped amorphous silicon (n$^+$a-Si:H) layer 224a may function as an ohmic contact layer.

Subsequently, an ashing process is performed on the photoresist pattern 220 so that the portion "F2" of the photoresist pattern 220 corresponding to the spaced region "E" may be completely removed, and the portion "F1" of the photoresist pattern 220 may be partially etched. Accordingly, portions of the first metal pattern 226 and the second metal pattern 232 corresponding to a region "W" may be exposed because a lateral side of the photoresist pattern 220 is also etched during the ashing process.

Figure 12E:
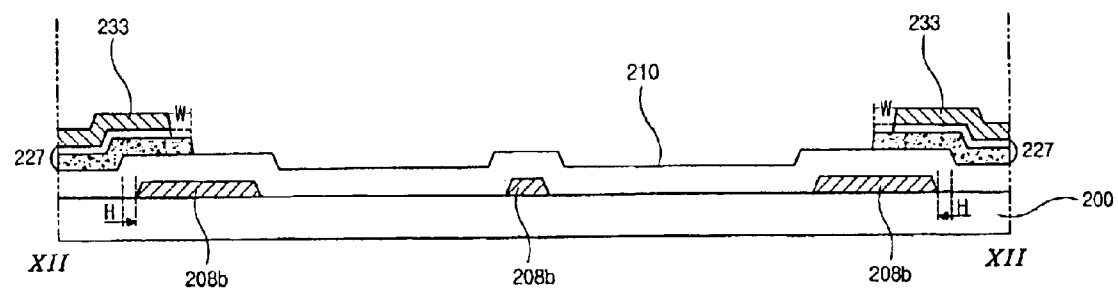

In FIG. 11E and FIG. 12E, the source electrode 228, the drain electrode 230, and the data line 233 may be formed by etching the exposed portions of the first metal pattern 226 and the second metal pattern 232 corresponding to the spaced region "E" and the region "W." As previously described, the source electrode 228 may have a U-shape and the drain electrode 230 may be disposed within the U-shape of the source electrode 228. Subsequently, the impurity-doped amorphous silicon (n+a-Si:H) layer 224a corresponding to the portions "W" of the data line 233 and the source and drain electrodes 228 and 230, and the impurity-doped amorphous silicon (n+a-Si:H) layer 224a corresponding to the spaced region "E" may be removed using dry etching. Consequently, the vertical portions 208b of the common electrode may extend to a lower side of the data line 233 adjacent to the vertical portions 208b of the common electrode so that the vertical portion 208b of the common electrode adjacent to the data line 233 overlap with a portion of the data line 233. Thus, since there is no spaced region between the data line 233 and the vertical portion 208b adjacent to the data line 233, the light leakage does not occur in the area between the data line 233 and the vertical portion 208b of the common electrode.

Figure 12F:
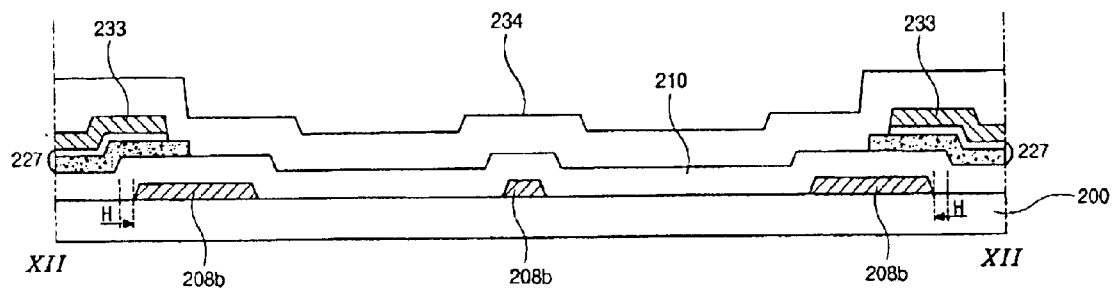

FIGS. 11F and 12F are cross-sectional views illustrating laminated structures of the array substrate after an exemplary third mask process according to the present invention. In FIGS. 11F and 12F, a passivation layer 234 may be formed by depositing transparent organic insulating materials, such as benzocyclobutene (BCB) and acrylic resin, onto an entire surface of the substrate 200 upon which the source electrode 228, the drain electrode 230, and the data line 233 are already formed. Subsequently, the passivation layer 234 may be patterned to form a drain contact hole 236 that exposes a portion of the drain electrode 230.

Figure 12G:
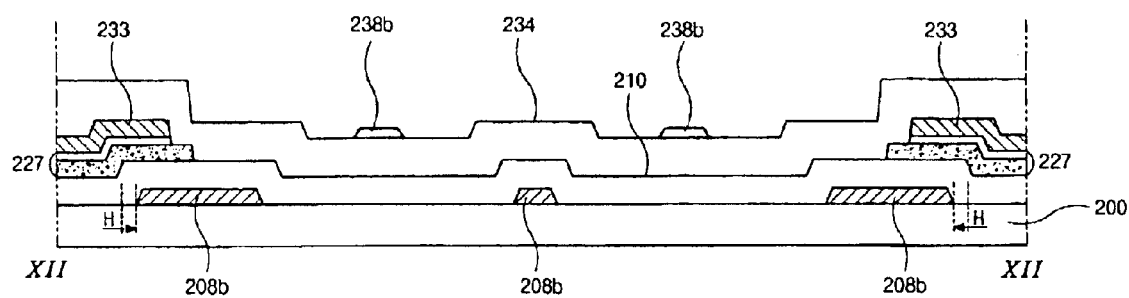

FIGS. 11G and 12G are cross-sectional views illustrating laminated structures of the array substrate after an exemplary fourth mask process according to the present invention. In FIGS. 11G and 12G, a pixel electrode 238 may include a first horizontal portion 238a, a plurality of vertical portions 238b, and a second horizontal portion 238c formed by depositing transparent conductive metal materials, such as indium tin oxide (ITO) and indium zinc oxide (IZO), onto an entire surface of the substrate 200 upon which the passivation layer 234 may already be formed, and then pattering it. The first horizontal portion 238a may be connected to the drain electrode 230 and may extend to the pixel region "P" (in FIG. 9). The plurality of vertical portions 238b of the pixel electrode 238 may vertically extend from the first horizontal portion 238a of the pixel electrode 238, and the second horizontal portion 238c of the pixel electrode 238 may be disposed over the storage line 206 and interconnect each of the plurality of vertical portions 238b. The second horizontal portion 238c and a portion of the storage line 206 may be combined to form a storage capacitor $C_{St}$ that uses the storage line as a first storage electrode and the second horizontal portion 238c as a second storage electrode.

Figure 13:
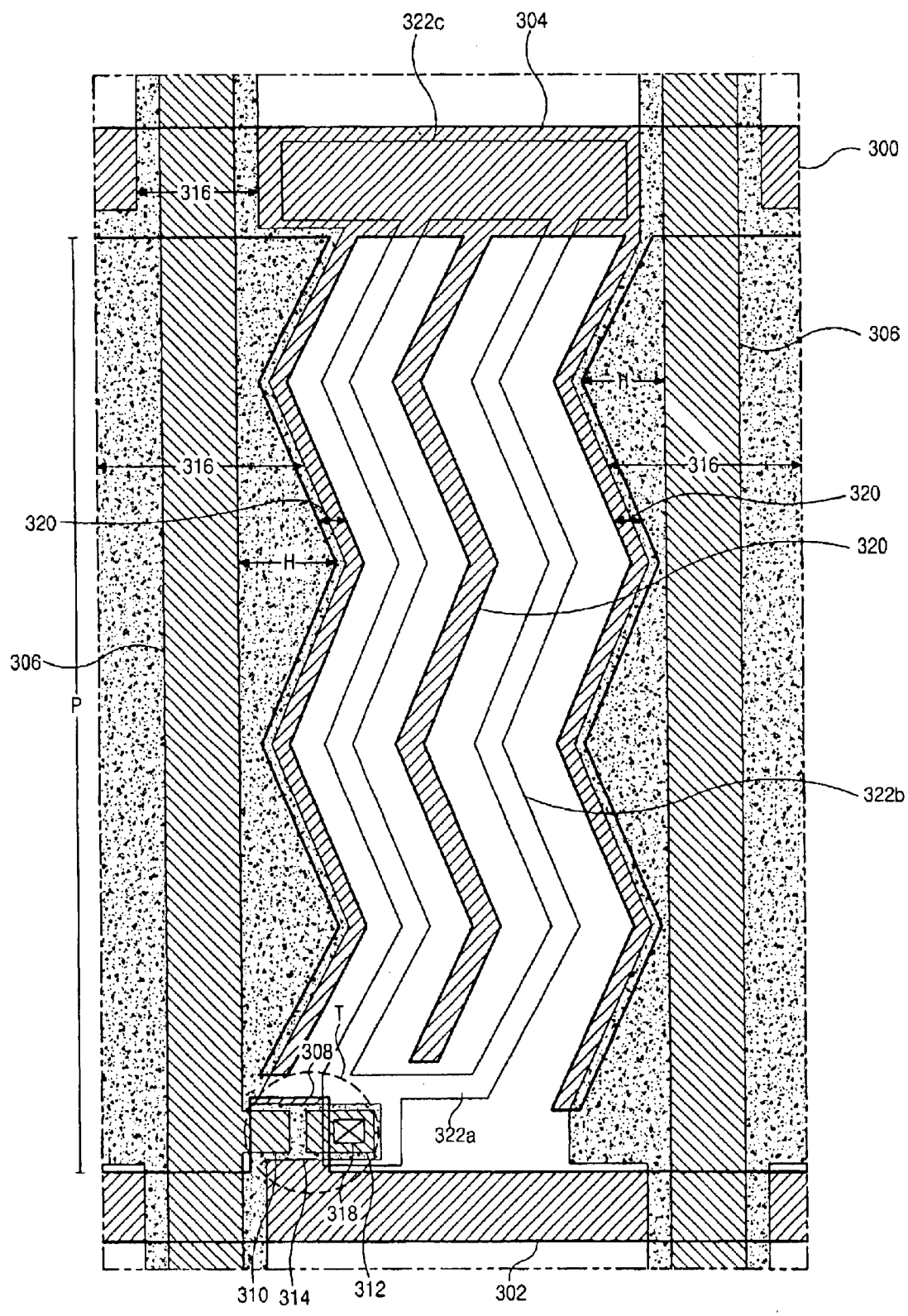
FIG. 13 is a plan view of an exemplary pixel of an array substrate for an in-plane switching (IPS) mode liquid crystal display (LCD) device according to the present invention.

FIG. 13 is a plan view of an exemplary pixel of an array substrate for an in-plane switching (IPS) mode liquid crystal display (LCD) device according to the present invention. In FIG. 13, a gate line 302 may be formed along a first direction on a substrate 300, a storage line 304 may be formed along the first direction on the substrate 300, and a data line 306 may formed along a second direction on the substrate 300, wherein the data line 306 may cross the gate line 302 and the storage line 306. A thin film transistor "T" having a gate electrode 308, a semiconductor layer 314, a source electrode 310, and a drain electrode 312 may be formed at a cross point of the gate line 302 and the data line 306. The gate electrode 308 may be connected to the gate line 302, and the source electrode 310 maybe connected to the data line 306. The drain electrode 312 may be spaced apart from the source electrode 310, and the semiconductor layer 314 may disposed between the gate electrode 308 and the source and drain electrodes 310 and 312. A common electrode 320 and a pixel electrode 322 may be formed within a pixel region defined by the cross point of the gate line 302 and the data line 306. The common electrode 320 may extend from the storage line 304, and the pixel electrode 322 may contact the drain electrode 312 through the drain contact hole 318. The common electrode 320 may include a plurality of vertical portions that extend from the storage line 304 and are arranged in a zigzag pattern. The pixel electrode 322 may include a first horizontal portion 322a, a plurality of vertical portions 322b, and a second horizontal portion 322c. The first horizontal portion 322a of the pixel electrode 322 may be connected to the drain electrode 312 and may extend to the pixel region "P." The vertical portions 322b of the pixel electrode 322 may vertically extend from the first horizontal portion 322a and may be arranged in zigzag patterns. In addition, the plurality of vertical portions 322b of the pixel electrode 322 may be arranged in an alternating pattern with the vertical portions of the common electrode 320. A semiconductor line 316 that extends from the semiconductor layer 314 may be formed under the data line 306. Accordingly, since the semiconductor line 316 may be formed by the half-tone mask process according to the present invention, it may also freely extend on the array substrate having a pattern similar to the zigzag patterns of the common electrode 320 and the pixel electrode 322. Thus, since semiconductor line 316 under the data line 306 extends to a lower side of the common electrode that is adjacent to the data line 306, the extended semiconductor line 316 can block spaced regions between the data line 306 and the common electrode 320 adjacent to the data line 306 so that the light irradiated from a light source under the substrate 300 may not leak into the spaced regions between the data line 306 and the common electrode 320.

In addition, the in-plane switching (IPS) mode liquid crystal display (LCD) device having zigzag-shaped common and pixel electrodes may obtain a multi-domain structure, wherein molecules of liquid crystal material are not arranged along a common direction but are arranged in many different directions. Accordingly, an in-plane switching (IPS) mode liquid crystal display (LCD) device having a symmetric multi-domain structure may minimize a color shift phenomenon by offsetting birefringence that depends on the alignment direction of the liquid crystal. In addition, an area that is free of a gray-level inversion may be enlarged.

The present invention provides the in-plane switching (IPS) mode liquid crystal display (LCD) device in which the spaced region between the data line and the electrode adjacent to the data line is shielded by the extended semiconductor line or the extended electrodes adjacent to the data line so that the light leakage are avoided in the spaced region. Accordingly, since the light leakage does not happen within the spaced regions between the data line and the neighboring electrode, an image display quality of the liquid crystal display (LCD) device can be improved. In addition, since the present invention adopts a four-mask process for manufacturing the array substrate of the in-plane switching (IPS) mode liquid crystal display (LCD) device instead of a five-mask process, production time and materials may be reduced. Thus, manufacturing yield can be increased.

It will be apparent to those skilled in the art that various modifications and variations can be made in the array substrate for IPS mode liquid crystal display device and method for fabricating the same of the present invention without departing from the spirit or scope of the invention.

Thus, it is intended that the present invention cover the modifications and variations of this invention provided they come within the scope of the appended claims and their equivalents.

What is claimed is:

1. An array substrate for an in-plane switching (ISP) mode liquid crystal display (LCD) device, comprising:

a gate line formed along a first direction on a substrate;

a storage line formed along the first direction on the substrate and spaced apart from the gate line;

a data line formed along a second direction on the substrate, the data line defining a pixel region by crossing the gate line;

a thin film transistor at a crossing of the gate line and the data line, the thin film transistor having a gate electrode, a semiconductor layer, a source electrode, and a drain electrode;

a pixel electrode connected to the drain electrode;

a common electrode having a plurality of vertical portions connected to the storage line, the common electrode having outermost vertical portions adjacent and parallel to the data line and spaced apart from the pixel electrode; and a semiconductor line beneath the data line and extending from the semiconductor layer to both sides of the data line to cover portions of the common electrodes adjacent to the data line.

2. The array substrate according to claim 1, wherein the semiconductor layer and the semiconductor line include an amorphous silicon layer and an impurity-doped amorphous silicon layer.

3. The array substrate according to claim 2, wherein the amorphous silicon layer extends to both sides of the data line to cover portions of the common electrode adjacent to the data line.

4. The array substrate according to claim 1, wherein the common electrode of the pixel region is electrically connected to another common electrode of an adjacent pixel region.

5. The array substrate according to claim 1, wherein the pixel electrode includes a first horizontal portion that extends from the drain electrode, a plurality of vertical portions that vertically extend from the first horizontal portion to the pixel region and are arranged in an alternating pattern with the vertical portions of the common electrode, and a second horizontal portion that interconnects each of the plurality of vertical portions.

6. The array substrate according to claim 5, wherein the second horizontal portion of the pixel electrode and a portion of the storage line form a storage capacitor.

7. The array substrate according to claim 5, wherein the vertical portion of the common electrode and the vertical portion of the pixel electrode have zigzag-shaped patterns.

8. The array substrate according to claim 1, wherein the vertical portions of the common electrode vertically extend from the storage line to the pixel region and are arranged in an alternating pattern with the vertical portions of the pixel electrode.

9. An array substrate for an in-plane switching (IPS) mode liquid crystal display (LCD) device, comprising:

a gate line formed along a first direction on a substrate;

a storage line formed along the first direction on the substrate and spaced apart from the gate line;

a data line formed along a second direction on the substrate, the data line defining a pixel region by crossing the gate line;

a thin film transistor at a crossing of the gate line and the data line, the thin film transistor having a gate electrode, a semiconductor layer, a source electrode, and a drain electrode;

a pixel electrode connected to the drain electrode;

a common electrode having a plurality of vertical portions connected to the storage line, the common electrode having outermost vertical portions adjacent and parallel to the data line, the outermost vertical portions adjacent to the data line extend to partially overlap with a portion of the data line; and a semiconductor line beneath the data line and extending from the semiconductor layer to both sides of the data line, wherein the semiconductor layer and the semiconductor line include an amorphous silicon layer and an impurity-doped amorphous silicon layer, and the amorphous silicon layer of the semiconductor line is exposed at both sides of the data line.

10. The array substrate according to claim 9, wherein the common electrode of the pixel region is connected to the common electrode of an adjacent pixel region.

11. The array substrate according to claim 9, wherein the pixel electrode includes a first horizontal portion that extends from the drain electrode, a plurality of vertical portions that vertically extend from the first horizontal portion to the pixel region and are arranged in an alternating pattern with the vertical portions of the common electrode, and a second horizontal portion that interconnects each of the plurality of vertical portions.

12. The array substrate according to claim 11, wherein the second horizontal portion of the pixel electrode and a portion of the storage line form a storage capacitor.

13. The array substrate according to claim 9, wherein the vertical portions of the common electrode vertically extend from the storage line to the pixel region and are arranged in an alternating pattern with the vertical portions of the pixel electrode.

14. The array substrate according to claim 9, wherein the pixel electrode includes one of indium tin oxide (ITO) and indium zinc oxide (IZO).

* * * * *